(12) United States Patent
Shida et al.

(10) Patent No.: US 6,692,214 B1
(45) Date of Patent: Feb. 17, 2004

(54) PUSHER, PULLER LOADER, UNLOADER, AND WORKING DEVICE

(75) Inventors: Satoshi Shida, Osaka (JP); Takashi Shimizu, Osaka (JP); Ryoji Inutsuka, Osaka (JP); Hiroaki Hayashi, Osaka (JP); Shinji Kanayama, Nara (JP); Yuichi Takakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 77 days.

(21) Appl. No.: 10/089,184

(22) PCT Filed: Sep. 28, 2000

(86) PCT No.: PCT/JP00/06699

§ 371 (c)(1),
(2), (4) Date: Jul. 17, 2002

(87) PCT Pub. No.: WO01/25123

PCT Pub. Date: Apr. 12, 2001

(30) Foreign Application Priority Data

| Oct. 1, 1999 | (JP) | 11-282042 |
| Nov. 19, 1999 | (JP) | 11-330512 |
| Mar. 13, 2000 | (JP) | 2000-69189 |

(51) Int. Cl.[7] ............................................. B65G 47/00
(52) U.S. Cl. ............................ 414/416.03; 198/468.9; 198/747
(58) Field of Search ................ 414/331.15, 331.16, 414/416.05, 416.08, 936; 198/747, 468.9

(56) References Cited

U.S. PATENT DOCUMENTS

| 4,961,370 A | * | 10/1990 | Sawyer .......................... 89/47 |
| 4,991,784 A | * | 2/1991 | Schmid .................... 242/390.3 |
| 5,251,892 A | * | 10/1993 | No et al. ..................... 271/184 |
| 5,330,716 A | * | 7/1994 | Shaw et al. .................... 422/63 |
| 5,551,821 A | * | 9/1996 | Hall ............................. 414/18 |
| 5,842,598 A | | 12/1998 | Tsuchida et al. |

FOREIGN PATENT DOCUMENTS

| GB | 912449 | 12/1962 |
| JP | 56-75327 | 6/1981 |
| JP | 60-75330 | 5/1985 |
| JP | 1-215099 | 8/1989 |
| JP | 1-137920 | 9/1989 |
| JP | 3-102534 | 10/1991 |
| JP | 7-170096 | 7/1995 |

* cited by examiner

Primary Examiner—Thomas J. Brahan
(74) Attorney, Agent, or Firm—Wenderoth, Lind & Ponack, L.L.P.

(57) ABSTRACT

A pusher 13 has a leaf spring 12, a driving section 22, a direction changing section 23, and guides 24. The driving section 22 nips the leaf spring to longitudinally advance and retract it. Advancement of a fore end of the leaf spring 12 in a pushing direction causes the object facing the leaf spring to be pushed from a first position to a second position. A direction changing section 23 bends the tail end of the leaf spring relative to the fore end so as to change the direction of advancement and retraction. Guides 24 guide the fore and tail ends with respect to the direction changing section.

20 Claims, 28 Drawing Sheets

US 6,692,214 B1

PUSHER, PULLER LOADER, UNLOADER, AND WORKING DEVICE

TECHNICAL FIELD

The present invention relates to a pusher and a puller, and a loader, an unloader, and a working apparatus having the pusher and the puller, which are suitable, for example, for handling circuit boards in operations in which semiconductor devices are installed on the circuit boards for manufacture of electronic circuit boards.

BACKGROUND ART

A number and types of components such as large and small connectors and electronic components that are mounted on an electronic circuit board have been increasing with diversification of functions of electronic equipment and increase in variety of electronic components. This involves advancement of techniques for microminiaturization and high-density mounting of electronic components and, on the other hand, involves use of large electronic circuit boards.

For example, a component mounting machine (b) for producing electronic circuit boards (a) as shown in FIG. 33 employs a loader (d) that pushes out circuit boards (c) from storage cassettes (f) to feed the boards to the component mounting machine (b) and an unloader (g) that pulls into storage cassettes (f) and stores electronic circuit boards (a) produced from circuit boards (c) mounted with electronic components (e) in the component mounting machine (b).

As shown in FIGS. 34 and 35, the loader (d) and the unloader (g) rectilinearly reciprocate a pushing member (j) or a pull piece (k) by an actuator, such as a screw shaft (h) and timing belt (i), that is reciprocated rectilinearly, and thereby load a circuit board (c) into the component mounting machine (b) or unload an electronic circuit board (a).

DISCLOSURE OF INVENTION

Both the storage cassettes (f) on the loader (d) from which the circuit boards (c) are pushed out and the storage cassettes (f) on the unloader (g) into which the electronic circuit boards (a) are pulled have a plurality of steps for receiving a circuit board (c) or an electronic circuit board (a) in each. The storage cassettes (f) are intermittently moved up and down by lifting and lowering mechanism not shown, so as to have the steps positioned sequentially at a specified height, in order that the circuit boards (c) may sequentially be pushed out from the steps or the electronic circuit boards (a) may sequentially be pulled into the steps.

As shown in FIG. 36, it is necessary for the pushing member (j) of the loader (d) to advance into a storage cassette (f) from a shelter position that is out of a lifting and lowering area (m) for the storage cassette (f), to push a circuit board (c) stored in the storage cassette (f), and to push out the board to an ulterior position that is out of the lifting and lowering area (m) for the storage cassette (f). As shown in FIG. 37, it is necessary for the pull piece (k) of the unloader (g) to pull an electronic circuit board (a) in a shelter position that is out of a lifting and lowering area (m) for a storage cassette (f), into the storage cassette (f) that is in the lifting and lowering area (m).

For this purpose, as shown in FIGS. 34 to 37, the loader (d) and the unloader (g) partially project far from lifting and lowering areas (m) for the storage cassettes (f) by a size (t) that is a sum of a size (S) in a direction in which a circuit board (c) or an electronic circuit board (a) is pushed or pulled and of an auxiliary space including a safety space for interference prevention and a supporting space for the pushing member (j) or the pull piece (k).

Movable parts that project partially and greatly in this manner are prone to encumber workers and surroundings and to make trouble. With such a great projection, a size of the loader (d) or the unloader (g) in a direction in which a circuit board (c) or an electronic circuit board (a) is moved is as large as on the order of 2.5 times that of the circuit board (c) or the electronic circuit board (a) that are to be handled, and therefore the sizes of the loader (d) and the unloader (g) for boards having a size of 200 mm are as large as on the order of 500 mm. A space to be occupied for installation of such a loader or such an unloader in combination with the component mounting machine (b) has to be so large that nowaday demand for space saving cannot be satisfied.

Where the component mounting machine (b) handles and mounts flip chip semiconductor devices, particularly, simplification of a geometry of junction between semiconductor devices and a circuit board, simplification of operations, and reduction in distance for the junction can be achieved by such a mounting method that bumps provided on electrodes on a semiconductor wafer are directly joined to electrodes on a circuit board (c), or the like. Such mounting operations, however, have to be performed in a clean room, and a monthly running cost required for light and fuel in a clean room having an area of 600 m$^2$, for example, is supposed to reach thirty million yen. In this case, therefore, such great projections on the loader (d) and the unloader (g) as described above are particularly problematic.

An object of the present invention is to provide a pusher and a puller which allow quantities of projection of a pushing mechanism and a pulling mechanism in directions of push and pull to be smaller than quantities of push and pull and which are suitable for space saving, and to provide a loader, an unloader, and a working apparatus having the pusher and the puller.

A first aspect of the invention provides a pusher for pushing an object from a first position to a second position, the pusher comprising: a leaf spring, a driving section for nipping the leaf spring to advance and retract it in a longitudinal direction so that advancement of a fore end portion of the leaf spring in a pushing direction causes the object facing the fore end portion of the leaf spring to be pushed from the first position to the second position, a direction changing section for bending a side of a tail end portion of the leaf spring being advanced and retracted relative to a side of the fore end portion extending in the pushing direction so as to change directions of advancement and retraction of the leaf spring at the direction changing section, and guides for guiding the side of the fore end portion and the side of the tail end portion of the leaf spring with respect to the direction changing section in the directions of advancement and retraction.

In such a configuration, the leaf spring exhibits a high flexural rigidity and an excellent rectilinearity because of its thickness, thickness distribution along a direction of a width thereof, shape of curve or bend with respect to the direction of the width, and the like, drive for advancement and retraction by the driving section is efficiently transmitted to the fore end portion directly or through the guides, the direction changing section, and the like, the facing object is pushed away without escape even though the fore end portion is in a released status in which the fore end portion protrudes from a guide on the side of the fore end portion when being advanced, and consequently, the leaf spring is capable of reliably pushing by a specified quantity the object to be pushed that is ahead of an initial push position on condition that the leaf spring is guided to immediate front of the initial push position. Besides, the direction changing section in middle of the leaf spring changes the direction of advancement and retraction of the spring from the pushing direction by bending the side of the tail end portion relative to the side of the fore end portion, and therefore a partial projection of the side of the tail end portion of the leaf spring, the guide for that side, and the like that is backward with respect to the pushing direction can be avoided, so that the problems with the partial projection are resolved. Moreover, a length from the direction changing section to the immediate front of the initial push position has only to be set in a range that narrowly satisfies a guiding function the guide on the side of the fore end portion performs by itself or in cooperation with the direction changing section for straight advancement of the fore end portion of the leaf spring, and a size of a site for installation of the pusher can be sufficiently smaller than a quantity of push by the fore end portion on the object to be pushed, regardless of the quantity, for space saving. As for a direction in which the side of the tail end portion of the leaf spring is bent for the change of the directions of advancement and retraction, selection of a side having the more room of an installation area prevents occurrence of problems such as obstruction to other equipment and expansion of the installation area on a side opposite to the direction of the bend.

Provided that a pair of rollers in the driving section, that is, both a driving roller and a pressure roller in pressure contact with the driving roller are shaped cylindrically, and that the driving roller also performs as a guide roller for changing the directions of advancement and retraction of the leaf spring, the change of the directions of advancement and retraction of the leaf spring and the drive for the advancement and retraction can be achieved by one and the same means in one place without strain resulting from slide friction, and simplification of structure and space saving are furthered.

In this case, provided that a position in which the pressure roller is in pressure contact with the driving roller is generally on a bisector passing through a center of the driving roller between the side of the fore end portion and the side of the tail end portion of the leaf spring, the pressure roller acts on a flattest portion of the leaf spring extending along the driving roller because the leaf spring having a curve with respect to the direction of the width is bent for the change of the directions of advancement and retraction while being flattened along the cylindrical shape of the driving roller. Accordingly, this arrangement prevents a great stress in the leaf spring that may be caused by forcible flatting of a portion of the leaf spring resistant to flatting, with pressure between the driving roller and the pressure roller acting out of the above-mentioned position, and thereby extends a life span of the leaf spring.

With the driving roller and the pressure roller configured so as not to come into contact with side edges of the leaf spring, a nipping pressure between the driving roller and the pressure roller is prevented from reaching both the side edges of the spring curved with respect to the direction of the width or both the side edges provided with bent portions, thick portions or the like. Thus mechanical external forces are prevented from acting on the side edges at which a quantity of deformation involved by the change of the directions of the leaf spring and termination of the change is large owing to the shape of the leaf spring and which thereby suffer damages easily, and the life span of the leaf spring is thereby further extended.

Provided that the guide on the side of the fore end portion and the guide on the side of the tail end portion have at least one pair of non-cylindrical rollers that is a combination of a concave roller and a convex roller or the like fitting with the shape of the leaf spring having a curve with respect to the direction of the width, the leaf spring can stably be advanced and retracted by the guides in cooperation with the direction changing section, without stress by the guides, with help of a high rectilinear rigidity of the leaf spring while the shape of the leaf spring having the curve with respect to the direction of the width is held.

Provided that a surface in which the directions of the leaf spring are changed is a horizontal surface perpendicular to a direction of gravity, the direction of the width of the leaf spring in which the leaf spring resists deformation points in the direction of gravity, so that droop by gravity of the fore end portion protruded from the guide can be prevented for ensuring stable push on an object to be pushed.

With a hardness of the leaf spring on the order of 430 to 489 Hv (Vickers hardness), the life span of the leaf spring is extended because stress by the change of the directions of advancement and retraction is reduced without impairment of characteristics on pushing.

With a roughness expressed by a standard numerical sequence of maximum heights on the side edges of the leaf spring not more than 25 S, the life span of the spring is extended because there is little unevenness having such a size that cracks and fracture may be caused by great deformation such as the bend for the change of the directions of advancement and retraction.

With a radius of curvature of the leaf spring with respect to the direction of the width on the order of 30 to 50 mm, satisfactory rectilinearity is achieved, a quantity of deformation by the change of the directions of the advancement and retraction is made smaller, stress is thereby reduced, and the life span of the spring is extended.

Provided that the leaf spring is cut from a material with a longitudinal direction of the spring set perpendicular to a drawing direction for the material, linear pattern of indentation caused by rollers in the direction perpendicular to the drawing direction in drawing of the spring material remains on the leaf spring in the longitudinal direction of the spring, directions of bending and stretching in the change of the directions of advancement and retraction of the leaf spring intersect the linear pattern by the rollers, stress concentration and mechanical stress that are caused by the deformation are reduced, and therefore damage to the leaf spring at an early stage can be prevented.

A second aspect of the invention provides a puller for pulling an object from a first position to a second position, the puller comprising: a leaf spring with a hook section on a fore end portion thereof, a driving section for nipping the leaf spring to advance and retract it in a longitudinal direction so that retraction of a fore end portion of the leaf spring in a pulling direction causes the object to be hooked by the hook section and pulled from the first position to the second position, at least one direction changing section for bending a side of a tail end portion of the leaf spring being advanced and retracted relative to a side of the fore end portion extending in the pulling direction so as to change direction of advancement and retraction of the leaf spring at the direction changing section, and guides for guiding the side of the fore end portion and the side of the tail end portion of the leaf spring with respect to the direction changing section in the directions of advancement and retraction.

In such a configuration, the leaf spring exhibits a high flexural rigidity because of its thickness, thickness distribution along a direction of a width thereof, shape of curve or bend with respect to the direction of the width, and the like, and drive for advancement and retraction by the driving section is satisfactorily transmitted to the fore end portion. In particular, an extensional rigidity of the leaf spring is so high that pull for retraction drive by the driving section is efficiently transmitted to the fore end portion directly or through the guides, the direction changing section, and the like, and an object to be pulled in an initial pull position can be pulled reliably without play and loss. Moreover, a distance from a terminal position of the pull to the direction changing section can be set smaller than a quantity of pull from the initial pull position to the terminal pull position, irrespective of the quantity of pull from the initial pull position to the terminal pull position, on a necessary minimum condition that the direction changing section can be provided. Even if a guide on the side of the fore end portion is provided so as to extend to the initial pull position, a maximum quantity of advancement of the leaf spring can be restricted so as to be roughly as small as the quantity of pull because the fore end portion of the leaf spring has only to hook an object to be pulled, in a range from the initial pull position to the terminal pull position. As a result, a size of projection of the puller can be minimized according to the quantity of pull, for space saving. As a direction in which the side of the tail end portion of the leaf spring is bent, selection of a side having the more room of an installation area prevents occurrence of problems such as obstruction to other equipment and expansion of the installation area on a side opposite to the direction of the bend.

Provided that the guide does not reach an advanced position of the fore end portion of the leaf spring, and that the side of the fore end portion that protrudes from the guide with advancement of the leaf spring has a curved portion that is curved with respect to the direction of the width and that extends over a length range longer than the protruded portion, the side of the fore end portion of the leaf spring protruded from the guide can be hooked reliably on an object to be pulled, without escape and can be pulled without aid of the guide because the side of the fore end portion ranging from a portion that is guided by the guide to an end of the protrusion is the curved portion curved with respect to the direction of the width and having a high flexural rigidity and an excellent rectilinearity. Accordingly, a quantity of fixed projection of the guide can be made smaller than the quantity of pull by a distance between the guide and the advanced position of the leaf spring.

With the direction changing section provided as guide rollers, rotation of the guide rollers with movement of the leaf spring prevents slide friction between the leaf spring and the direction changing section and the drive for advancement and retraction of the leaf spring with the change of directions is performed without strain.

With the side of the tail end portion of the leaf spring connected to a winding section, a space required for handling of a length of the leaf spring can be reduced by a size of a portion of the leaf spring that may be wound into the winding section.

With the direction changing section also performing as the winding section, maximal simplification of structure, further miniaturization and cost reduction are achieved.

Provided that a surface in which the directions of the leaf spring are changed is a vertical surface, required component members can be arranged with use of a dead space in the vertical surface, for saving horizontal space.

With provision of two direction changing sections, a space for arrangement of required component members can easily be made still smaller.

Provided that a hardness of the leaf spring is on the order of 370 to 429 Hv, suppression of stress and prolongation of life span of the spring are achieved even though there are two direction changing sections and/or even though the spring may be wound by the winding section.

A roughness of the side edges of the leaf spring equal to or less than 25 S is preferable by the same reason as in the pusher.

A radius of curvature with respect to the direction of the width of the leaf spring on the order of 20 to 50 mm provides a rectilinear rigidity required for pull without use of the guide, without reducing durability. As the radius approaches about 20 mm, a length of a portion that can be omitted of the guide forms an increasing proportion of a full length of the guide and a space for fixation and installation of the puller can be made small to that extent.

The leaf spring cut from a material with a longitudinal direction of the spring set perpendicular to a drawing direction for the material is preferable by the same reason as in the pusher.

A third aspect of the invention provides a loader for feeding a handling section with board-like members stored in a plurality of steps of a storage cassette, the loader comprising: a lifting and lowering section for lifting and lowering the storage cassette, and a pushing section for pushing the board-like member from the step of the storage cassette to the handling section, wherein the pushing section comprises: a leaf spring, a driving section for nipping the leaf spring to advance and retract it in a longitudinal direction so that advancement of a fore end portion of the leaf spring into the storage cassette in a pushing direction causes the board-like member facing the fore end portion of the leaf spring to be pushed from the storage cassette to the handling section, a direction changing section for bending a side of a tail end portion of the leaf spring being advanced and retracted relative to a side of the fore end portion extending in the pushing direction so as to change directions of advancement and retraction of the leaf spring at the direction changing section, a position detecting section for detecting a position of the leaf spring, and an abnormality detecting section for detecting an abnormal action of the leaf spring on the basis of a position detection signal from the position detecting section.

In such a configuration, the lifting and lowering section lifts and lowers the storage cassettes loaded thereon so that the board-like members stored in the steps may sequentially be positioned at a specified height subjected to pushing by the pushing section. In the pushing section, a high rectilinear rigidity of the leaf spring owing to its thickness, thickness distribution along the direction of the width, shape of curve or bend with respect to the direction of the width, and the like ensures efficient transmission of drive for advancement and retraction by the driving section to the fore end portion directly or through the guides, the direction changing section, and the like, advancement of the fore end portion into a storage cassette without aid of a guide, and reliable push of the facing board-like member without escape and service of the member for handling in other sections under a condition that the guides are provided so as to extend to immediate front of a lifting and lowering area for the storage cassettes. Besides, the direction changing section in middle of the leaf spring changes the direction of advancement and retraction of the spring from the pushing direction by bending the side of the tail end portion relative to the side of the fore end portion, and therefore problems with a great partial projection of the side of the tail end portion of the leaf spring, the guide for that side, and the like from the lifting and lowering section can be prevented. Moreover, a length from the direction changing section to the immediate front of the lifting and lowering area has only to satisfy a guiding range that the guide on the side of the fore end portion requires for rectilinearly advancing the fore end portion of the leaf spring by itself or in cooperation with the direction changing section, and a size of a site for installation of the pushing section can be sufficiently smaller than a quantity of push by the fore end portion on the board-like member, regardless of the quantity, for space saving. As for a direction in which the side of the tail end portion of the leaf spring is bent for the change of the directions of advancement and retraction, selection of a side having the more room of an installation area prevents occurrence of problems such as obstruction to other equipment and expansion of the installation area on a side opposite to the direction of the bend.

Also in the loader, preferably, a pair of rollers in the driving section, that is, both a driving roller and a pressure roller in pressure contact with the driving roller are shaped cylindrically, the driving roller doubles as a guide roller for changing the directions of advancement and retraction of the leaf spring, the guide on the side of the fore end portion and the guide on the side of the tail end portion have at least one pair of non-cylindrical rollers that is a combination of a concave roller and a convex roller or the like fitting with the shape of the leaf spring having a curve with respect to the direction of the width, and the pairs of non-cylindrical rollers on the side of the fore end portion are provided in immediate front of the lifting and lowering area that is immediate front of a protruded position of the leaf spring in the pushing section.

Provided that a surface in which the directions of the leaf spring are changed is a horizontal surface, a dead space extending in a direction at right angles to a loading direction in the lifting and lowering section can be used effectively.

A fourth aspect of the invention provides an unloader for taking board-like members out of a handling section into a plurality of steps in a storage cassette, the unloader comprising: a lifting and lowering section for lifting and lowering the storage cassette, and a pulling section for pulling the board-like member from the handling section into the step in the storage cassettes, wherein the pulling section comprises: a leaf spring with a hook section on a fore end portion thereof, a drive section for nipping the leaf spring to advance and retract it in a longitudinal direction so that retraction of the fore end portion of the leaf spring in a pulling direction causes the board-like member to be hooked by the hook section and pulled from the handling portion to the step of the storage cassette, at least one direction changing section for bending a side of a tail end portion of the leaf spring being advanced and retracted relative to a side of the fore end portion extending in the pulling direction so as to change directions of advancement and retraction of the leaf spring at the direction changing section, and guides for guiding the side of the fore end portion and the side of the tail end portion of the leaf spring with respect to the direction changing section in the directions of advancement and retraction.

In such a configuration, the lifting and lowering section lifts and lowers the storage cassettes loaded thereon so that the steps may sequentially be positioned at a specified height subjected to pull of a board-like member by the pulling section. In the pulling section, a flexural rigidity of the leaf spring owing to its thickness, thickness distribution along the direction of the width, shape of curve or bend with respect to the direction of the width, and the like ensures satisfactory transmission of drive for advancement and retraction by the driving section to the fore end portion. In particular, because of a particularly high extensional rigidity of the leaf spring, pull of retraction drive by the driving section is efficiently transmitted to the fore end portion directly or through the guides, the direction changing section, so that a board-like member in an initial pull position can be pulled reliably without play and loss and can be stored into a storage cassette. Moreover, a distance from a terminal pull position where the pull terminates to the direction changing section can be set smaller than a quantity of pull from the initial pull position to the terminal pull position, irrespective of the quantity of pull from the initial pull position to the terminal pull position, on a necessary minimum condition that the direction changing section can be provided. Even if a guide on the side of the fore end portion is provided so as to extend to the initial pull position, the distance can be restricted so as to be roughly as small as the quantity of pull because the fore end portion of the leaf spring has only to hook a board-like member in a range from the initial pull position to the terminal pull position. As a result, a size of a site for installation of the pulling section can be made sufficiently small according to the quantity of pull, for space saving. As a direction in which the side of the tail end portion of the leaf spring is bent, selection of a side having the more room of an installation area prevents occurrence of problems such as obstruction to other equipment and expansion of the installation area on a side opposite to the direction of the bend.

Also in the unloader, preferably, a part of the side of the fore end portion of the leaf spring is formed as a curved portion curved with respect to the direction of the width and extending over a length range longer than a range that is protruded from the guide with advancement of the leaf spring, the direction changing sections are guide rollers, the tail end portion of the leaf spring is connected to a winding mechanism, a surface in which the directions of the leaf spring are changed is a vertical surface, and two direction changing sections are provided.

A fifth aspect of the invention provides a working apparatus for performing repetitive operations on a plurality of board-like members, the apparatus having a mounting machine that repeats delivery of a board-like member from a take-in section, operations on the delivered board-like member, and delivery of the finished board-like member to the take-out section, the loader of the third aspect of the invention for feeding a board-like member stored in a plurality of steps in a first storage cassette, to the take-in section of the mounting machine, and the unloader of the fourth aspect of the invention for taking out a board-like member from a carry-out section of the mounting machine and storing the member into a plurality of steps in a second storage cassette.

With use of the loader and the unloader having the above characteristics in such a configuration, handling by the mounting machine a board-like member stored in a plurality of steps in a storage cassette, performing specified operations on the board-like member, and storing the finished board-like member into a plurality of steps in a storage cassette can be repeated automatically, while saving space for the whole apparatus including the loader and the unloader is achieved.

Provided that both the pusher and the puller in the above configuration have a rectilinear-advancement guide for preventing flexure of the leaf spring, as a guide on the side of the tail end portion of the leaf spring, flexure of the leaf spring being advanced and retracted can be prevented for facilitating smooth operation while cost reduction is achieved by employment of common components.

With provision of an abnormal collision detecting section for detecting abnormal collision in which the fore end portion of the leaf spring encounters a load not smaller than a given magnitude, such abnormal collision can be coped with. In this case, such abnormality can automatically be coped with if a controlling section is provided which stops drive of the leaf spring in response to abnormal collision detection signal from the abnormal collision detecting section. The abnormal collision detecting section may have a controlling system that is provided in a drive system for the leaf spring and that cuts off transmission of the drive when the abnormal collision detecting section detects abnormality.

With provision of a position detecting section for the leaf spring and an abnormality detecting section that detects malfunction of the leaf spring on basis of position detection signal for the leaf spring from the position detecting section, such malfunction can be coped with. In this case, the abnormality detecting section may detect malfunction of the leaf spring on basis of position detection signal and an operating condition of the pusher at the moment or may detect malfunction of the leaf spring on basis of comparison between position detection signals for two or more positions from detecting sections.

The malfunction can be managed, with provision of a travel quantity detecting section for detecting a quantity of travel of the leaf spring and an abnormality detecting section for detecting abnormality of the leaf spring on basis of travel quantity detection signal from the travel quantity detecting section. In this case, the abnormality detecting section may detect abnormality of the leaf spring by comparison of the quantity of travel of the leaf spring detected by the travel quantity detecting section with a reference quantity of travel that is a quantity of travel of a normal leaf spring.

The travel quantity detecting section may have sections to be detected that are provided along a longitudinal direction on the side of the fore end portion of the leaf spring, a detecting section for detecting the sections to be detected, at a specified position adjacent to a course of advancement and retraction of the leaf spring, and a counter for counting a number of times the detecting section has detected the sections to be detected with advancement and retraction of the leaf spring, and the counted number may be regarded as a quantity of travel of the leaf spring.

The abnormality detecting section may detect abnormality of the leaf spring on basis of travel quantity detection signal for the leaf spring and an operating condition of the pusher at the moment or may detect abnormality of the leaf spring by comparison between quantities of travel of two or more sites on the leaf spring.

The abnormality detecting section may monitor pulse signal generated from the detecting section that is detecting the sections to be detected on the leaf spring, and a pulse width of the pulse signal exceeding a specified quantity may be judged as abnormality of a motor for driving the leaf spring.

With provision of a torque detecting section for detecting a value of torque of the motor for driving the leaf spring, the abnormality detecting section may compare the value of torque with a quantity of travel of the leaf spring and may detect occurrence of slip between the leaf spring and the driving section for the leaf spring, so that malfunction can be coped with.

The reference quantity of travel of the leaf spring may be set in conformity with a push stroke for a board-like member that requires the largest push stroke for various types of board-like members or reference quantities of travel of the leaf spring may previously be set according to types of board-like members and may be switched with recognition of an identification code provided on a board-like member.

BEST MODE FOR CARRYING OUT THE INVENTION

Hereinbelow, a pusher and a puller, and a loader, an unloader, and a working apparatus having the pusher and the puller in accordance with embodiments of the invention will be described in detail with reference to FIGS. 1 to 32.

First Embodiment

Figure 1:
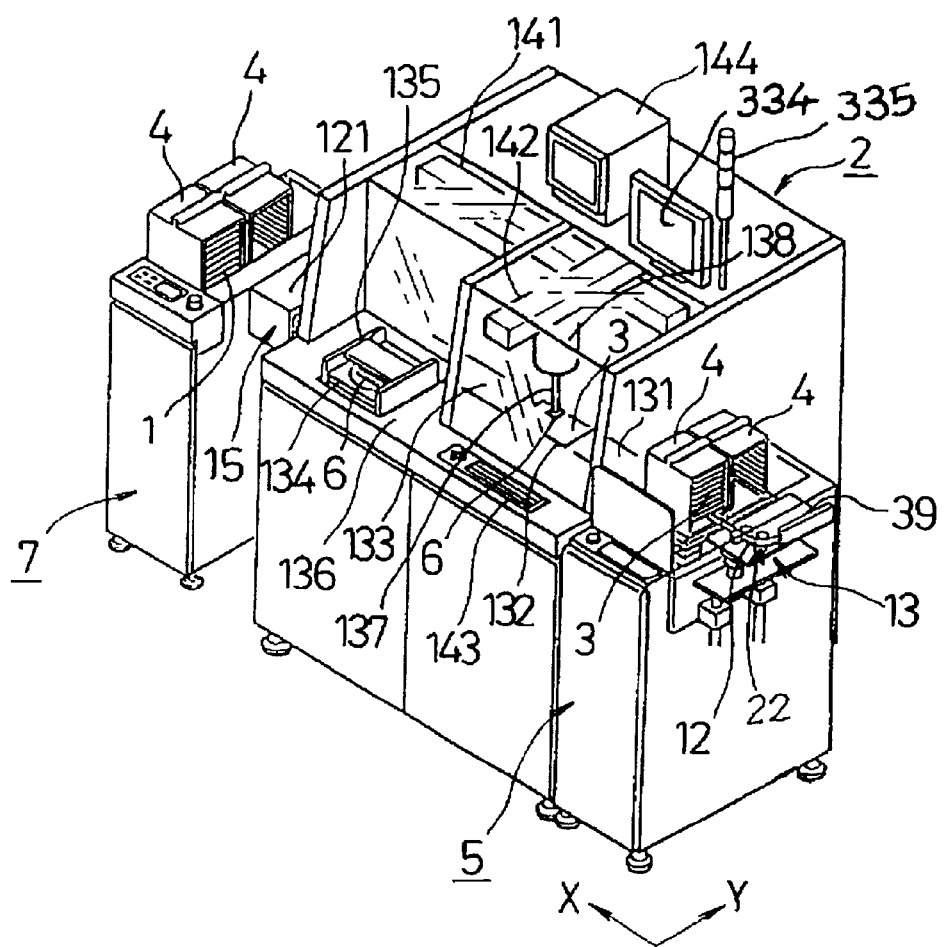
FIG. 1 is a view showing a general configuration of a working apparatus for producing electronic circuit boards that is an example in accordance with a first embodiment of the invention.

A first embodiment shown in FIGS. 1 to 17 is an example of a working apparatus in which a component mounting machine 2 that mainly produces such electronic circuit boards 1 as shown in FIG. 1 is used in combination with a loader 5 for pushing out circuit boards 3 from storage cassettes 4 to feed the boards to the mounting machine 2 and an unloader 7 for pulling and storing into empty storage cassettes 4 the electronic circuit boards 1 produced from the circuit boards 3 mounted with electronic components 6 in the mounting machine 2.

Figure 2:
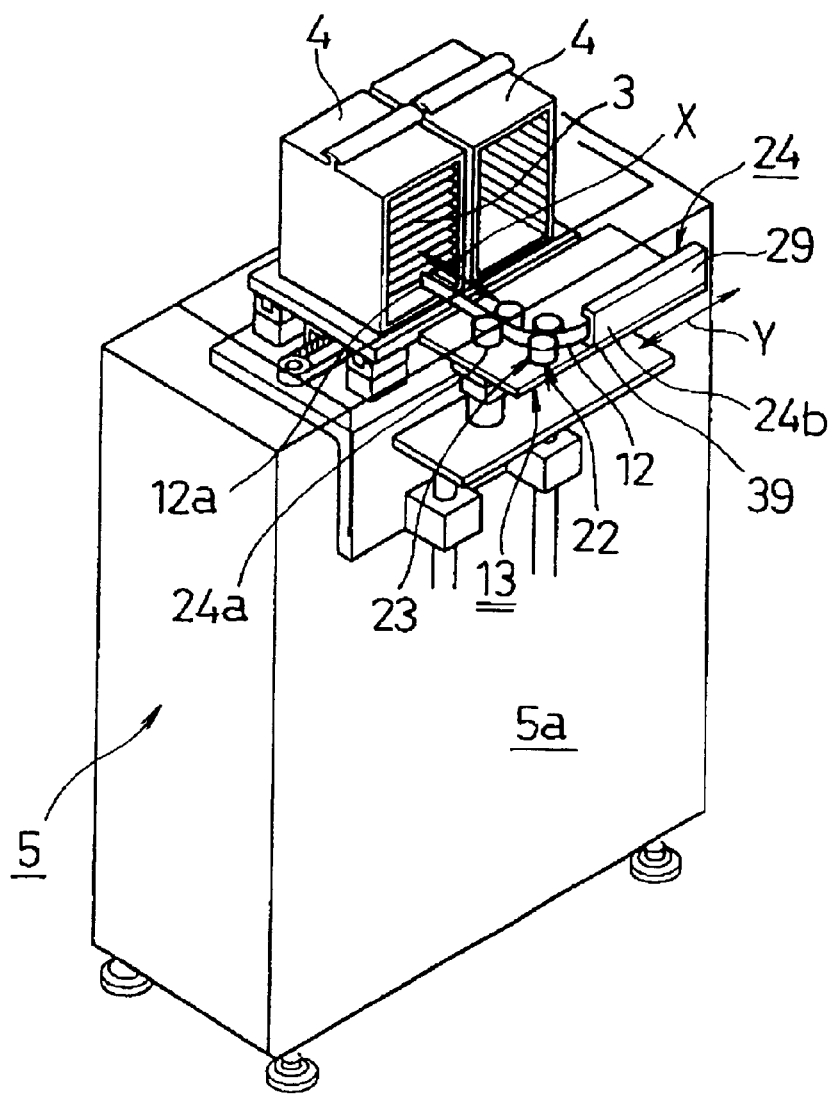
FIG. 2 is a perspective view showing a loader of the apparatus of FIG. 1.
Figure 12:
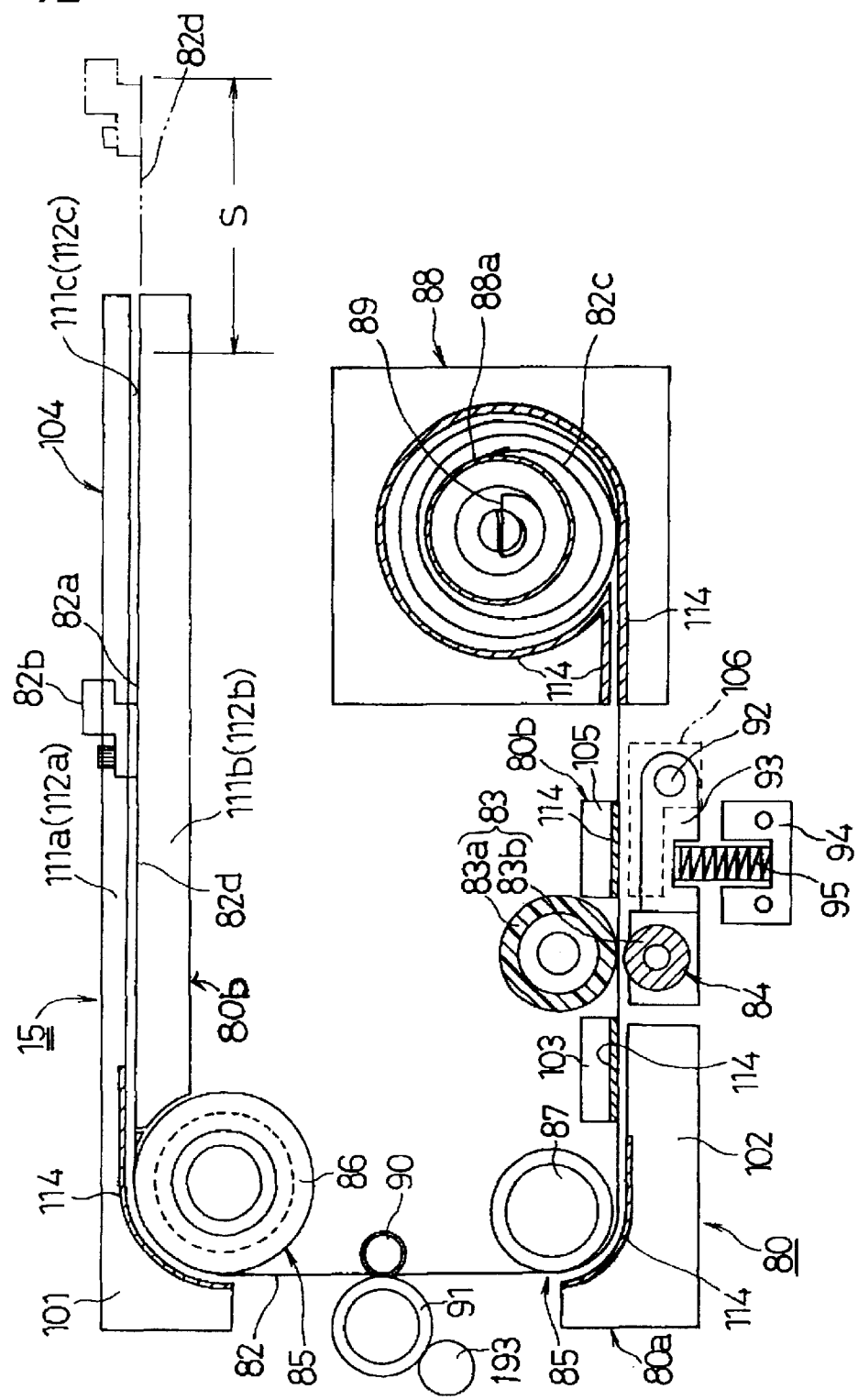
FIG. 12 is a sectional view showing an internal mechanism of the puller of FIG. 11.

The invention, however, is not limited to the above but may be adapted for all kinds of working apparatus including ones that handle various board-like objects and ones that perform various operations such as processing and printing. The loader 5 and the unloader 7 may be adapted for transferring board-like members between instruments that require feeding or unloading of the board-like members, instead of being adapted for work machines that perform various operations such as the mounting machine 2. The loader 5 employs a pusher 13 using a leaf spring 12 as shown in FIG. 2, for pushing out and feeding a circuit board 3 as an example of a board-like member from a storage cassette 4 to the mounting machine 2, and the unloader 7 employs a puller 15 using a leaf spring 82 as shown in FIG. 12, for taking out an electronic circuit board 1 as an example of a board-like member produced by the mounting machine 2 and storing the board in an empty storage cassette 4. The pusher 13 and the puller 15, however, may effectively be adapted in general for pushing or pulling various objects instead of such board-like members. Besides, specific configurations of the above elements are not limited to those shown in the drawings.

The pusher 13 is composed of a base 39 shown in FIGS. 1 to 3 and FIG. 7 and having thereon the leaf spring 12 curved with respect to a direction of a width thereof as shown in FIGS. 1, 4, 6, and 7, a driving section 22 that advances or retracts the leaf spring 12 in a longitudinal direction by nipping the spring between a pair of driving rollers 21 as shown in FIGS. 1, 2, 4, and 7 and causes a fore end portion 12a of the spring to push a facing circuit board 3 as an example of an object to be pushed, each time the fore end portion 12a is advanced, a direction changing section 23 that changes direction of advancement and retraction of the leaf spring 12 from a pushing direction X—X to a direction Y—Y by bending a tail end portion 12b of the leaf spring 12 being advanced and retracted, for example, into a generally right angle to a side of the fore end portion 12a, and guides 24 that guide the side of the fore end portion 12a and a side of the tail end portion 12b of the leaf spring 12 divided by the direction changing section 23 in the directions of advancement and retraction.

Figure 4:
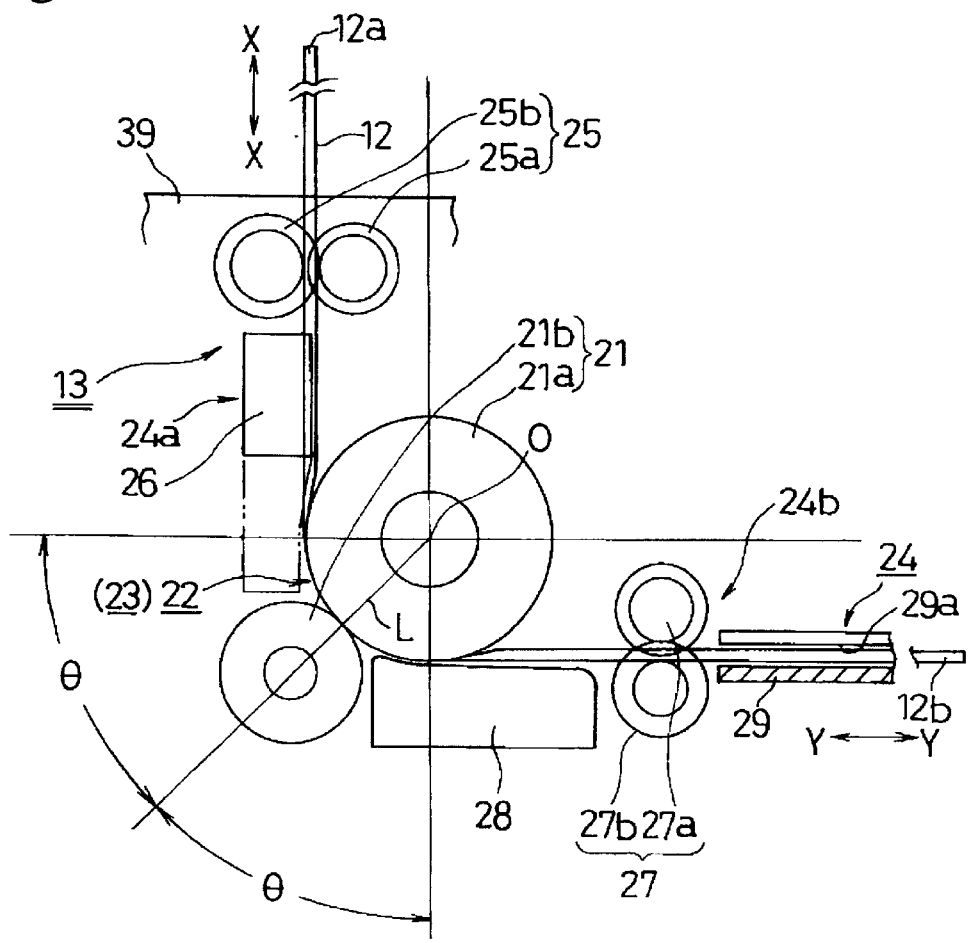
FIG. 4 is a plan view showing a main part of the pusher of FIG. 3.

The leaf spring 12 is curved with respect to the direction of the width over a full length thereof so as to have a high flexural rigidity in the longitudinal direction and an excellent rectilinearity. Therefore, drive for advancement and retraction of the leaf spring 12 caused by the driving section 22 is efficiently transmitted to the fore end portion 12a directly or through the guides 24, the direction changing section 23, and the like, and a facing circuit board 3 can be pushed away without escape as shown in FIGS. 1 and 2, even though the fore end portion 12a is in a released status in which the portion 12a protrudes as shown in FIG. 4 from a guide 24a on the side of the fore end portion 12a defined by the pair of driving rollers 21 when being advanced. Accordingly, the guide 24a guides the leaf spring 12 to immediate front of an initial push position as shown in FIG. 4 and the leaf spring 12 reliably pushes a circuit board 3 ahead of the initial push position. On the fore end portion 12a is provided a pushing member 20 (see FIG. 7) made from synthetic resin, having a shape and a size suitable for pushing a circuit board 3, and secured by screws or the like to the fore end portion 12a.

The direction changing section 23 in middle of the leaf spring 12 changes the directions of advancement and retraction of the spring 12 from the pushing direction X—X to the direction Y—Y by bending the side of the tail end portion 12b relative to the side of the fore end portion 12a, and therefore a great partial projection of the tail end portion 12b of the leaf spring 12, the guide 24b, and the like that is backward with respect to the pushing direction X—X can be avoided, so that problems with the partial projection are resolved.

A length from the direction changing section 23 to the immediate front of the initial push position has only to be set in a range that narrowly satisfies a guiding function so that the guide 24a on the side of the fore end portion 12a performs by itself or in cooperation with the direction changing section 23 for straight advancement of the fore end portion 12a of the leaf spring 12, and a size of a site for installation of the pusher can be sufficiently smaller than a quantity of push on a circuit board 3 by the fore end portion 12a, regardless of the quantity, for saving space. As for a direction in which the side of the tail end portion 12b of the leaf spring 12 is bent for the change of the direction of advancement and retraction, selection of a side having the more room of an installation area for the loader 5 and the like using the pusher 13 prevents interference between the leaf spring 12 and other members and saves space.

In particular, the leaf spring 12 of which the directions of advancement and retraction are changed squarely in general from the direction X—X to the direction Y—Y as in the embodiment shown in the drawings is suitable for saving space because such a leaf spring 12 minimizes a quantity of projection of the side of the tail end portion 12b and can easily be made to extend along a shape of a casing 5a of the loader 5.

Figure 5:
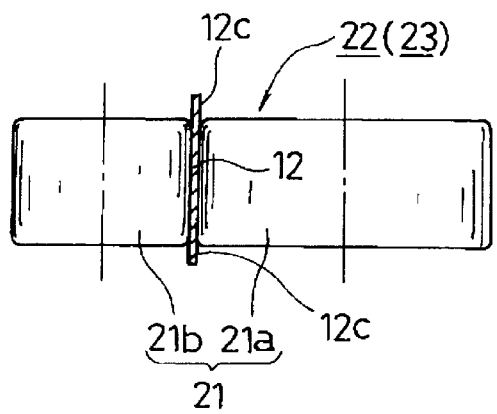
FIG. 5 is a sectional view showing a pair of driving rollers in the pusher of FIG. 3.

The pair of driving rollers 21 in the driving section 22 shown in FIGS. 1, 2, 4, and 5, that is, both a driving roller 21a and a pressure roller 21b in pressure contact with the roller 21a are shaped cylindrically as shown in FIGS. 4 and 5, and the driving roller 21a also performs as a guide roller that constitutes the direction changing section 23 for changing the directions of advancement and retraction of the leaf spring 12. With this arrangement, the change in the directions of advancement and retraction of the leaf spring 12 and the drive for the advancement and retraction can be achieved by one and the same means in one place having a compact simple structure, for space saving, and the pair of driving rollers 21 can be driven smoothly for advancement and retraction with the change of the directions, without slide friction against the leaf spring 12 and with a sufficient contact area kept between the rollers 21 and the leaf spring 12. For reliable drive of the leaf spring 12 with little stress and without slip, one of the driving roller 21a and the pressure roller 21b of the pair of driving rollers 21 is preferably made of an elastic body such as polyurethane rubber and the other is preferably a metal roller. In the embodiment shown in the drawings, the driving roller 21a is an elastic roller in which a layer of polyurethane rubber is provided on a surface of a metal core. The larger a diameter of the driving roller 21a constituting the direction changing section 23 is, the smaller a stress that the roller 21a imposes on the leaf spring 12 is. The diameter of the roller 21a is preferably on the order of 25 mm or larger.

The leaf spring 12 curved with respect to the direction of the width thereof as described above is bent so as to follow the cylindrical shape of the driving roller 21a, for the change of the directions of advancement and retraction, and the pressure roller 21b is in pressure contact with the driving roller 21a, preferably in a position set as shown in FIG. 4. That is, as shown in FIG. 4, the preferable position in which the pressure roller 21b is in pressure contact with the driving roller 21a is generally on a bisector L passing through a center O of the driving roller 21a between the side of the fore end portion 12a and the side of the tail end portion 12b of the leaf spring 12. With such setting of the pressure contact position of the pressure roller 21b on the driving roller 21a, a pressure of the pressure roller 21b acts on a flattest portion of the leaf spring 12 extending along the driving roller 21a. This arrangement prevents a great stress in the leaf spring 12 that may be caused by forcible flatting of a portion of the leaf spring 12 resistant to flatting with pressure between the driving roller 21a and the pressure roller 21b, and thereby extends a life span of the leaf spring 12. In the arrangement shown in the drawings, an angle between the direction X—X and the direction Y—Y is 90 degrees, and therefore the bisector L forms angles of 45 degrees with those directions.

As shown in FIG. 5, widths of the driving roller 21a and the pressure roller 21b are smaller than the width of the leaf spring 12 so that the driving roller 21a and the pressure roller 21b may not be in contact with side edges 12c of the leaf spring 12. This arrangement prevents a nipping pressure between the driving roller 21a and the pressure roller 21b from reaching both the side edges 12c, 12c of the spring 12 at which a quantity of deformation involved by the change of the directions of the leaf spring 12 and termination of the change is largest and which easily suffer damages by the deformation. Thus the arrangement prevents such mechanical external forces from acting on the side edges and thereby further extends the life span of the leaf spring 12. In addition, edges of both the driving roller 21a and the pressure roller 21b are roundly chamfered so as not to provide the leaf spring 12 with stress and scratches by the edges, and this configuration also extends the life span of the leaf spring 12.

The guide 24a may be configured in any way. In the embodiment shown in FIGS. 1, 2, 4, and 7, however, the guide 24a is a combination of a pair of guide rollers 25 situated in immediate front of the initial push position of the fore end portion 12a of the leaf spring 12 and of a fixed guide 26 that guides the leaf spring 12 from outside between the pair of guide rollers 25 and the pair of driving rollers 21 to advance the spring 12 rectilinearly toward the pair of guide rollers 25, and the guide 24a can be used safely even if the fore end portion 12a retracts and comes off from the pair of guide rollers 25. If the fixed guide 26 extends to immediate front of the pair of driving roller 21 as shown by an imaginary line, the fore end portion 12a of the leaf spring 12 that is forwarded from the pair of driving roller 21 can be guided so as to reach the pair of guide rollers 25. In this case, the leaf spring 12 can be inserted from the side of the guide 24b on the side of the tail end portion 12b to the pair of guide rollers 25 so as to be set ready for use on condition that the driving section 22 and the guides 24 have already been installed, and this feature is advantageous in replacement of the leaf spring 12.

The guide 24b also may be configured in any way. In the embodiment shown in FIGS. 1, 2, 4, and 7, however, the guide 24b is composed of a pair of guide rollers 27 situated in vicinity of the pair of driving rollers 21, a fixed guide 28 that is situated between the pair of guide rollers 27 and the pair of driving rollers 21 and that guides from outside the fore end portion 12a of the leaf spring 12 forwarded from the pair of guide rollers 27 so as to cause the fore end portion 12a to be bitten between the pair of driving rollers 21, and a rectilinear-advancement guide 29 that is situated in front of the pair of guide roller 27, that guides the leaf spring 12 toward the pair of guide rollers 27, and that prevents the leaf spring 12 from being bent.

Figure 6:
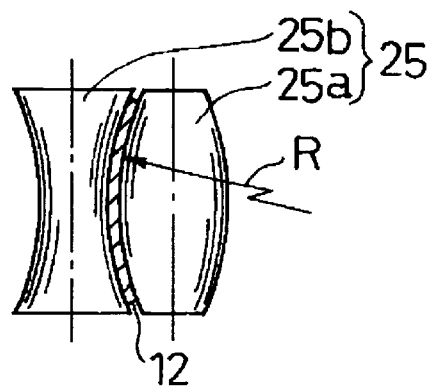
FIG. 6 is a sectional view showing a pair of guide rollers in the pusher of FIG. 3.

As shown in FIGS. 4 and 6, each of the guides 24a and 24b on the side of the fore end portion 12a and on the side of the tail end portion 12b may have a pair of guide rollers 25, 27, i.e., a pair of non-cylindrical rollers that is a combination of a convex roller 25a, 27a and a concave roller 25b, 27b fitting with the shape of the leaf spring 12 curved with respect to the direction of the width thereof. With this arrangement, the shape of the leaf spring 12 curved with respect to the direction of the width can be held, and the leaf spring 12 can stably be advanced and retracted by the guide rollers in cooperation with the direction changing section 23, without mechanical stress that might be caused by deformation by the guides 24a and 24b, with help of a high rectilinear rigidity of the leaf spring 12. As for such pairs of non-cylindrical rollers, at least one set of the rollers arranged in neighborhood of the direction changing section 23 are sufficient for each of the guides 24a and 24b.

Figure 7:
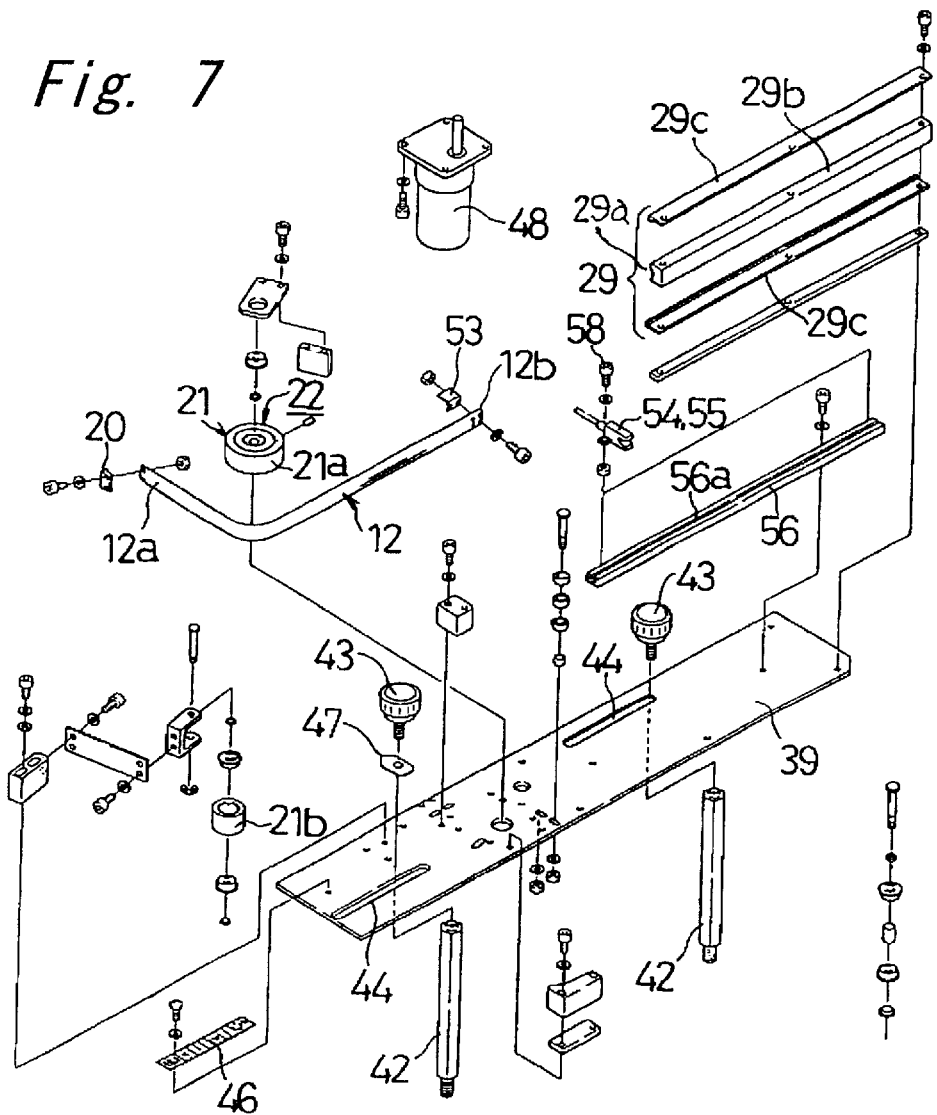
FIG. 7 is an exploded perspective view of the pusher of FIG. 3.

The rectilinear-advancement guide 29 of the guide 24b is a C-shaped groove guide as shown in FIGS. 2 to 4 and FIG. 7, and guides in a groove 29a the leaf spring 12 curved with respect to the direction of the width so that the leaf spring 12 advances rectilinearly while keeping the original shape and having a little play without suffering stress by external forces. As shown in FIG. 7, the groove 29a extends longitudinally through the rectilinear-advancement guide 29, and the leaf spring 12 can freely be drawn from and inserted into the groove. The groove 29a is shaped by a rail base 29b and L-shaped guide plates 29c and 29c fixed to top and bottom of the base by screws or the like. Such a specific structure, however, may be designed appropriately.

Figure 8:
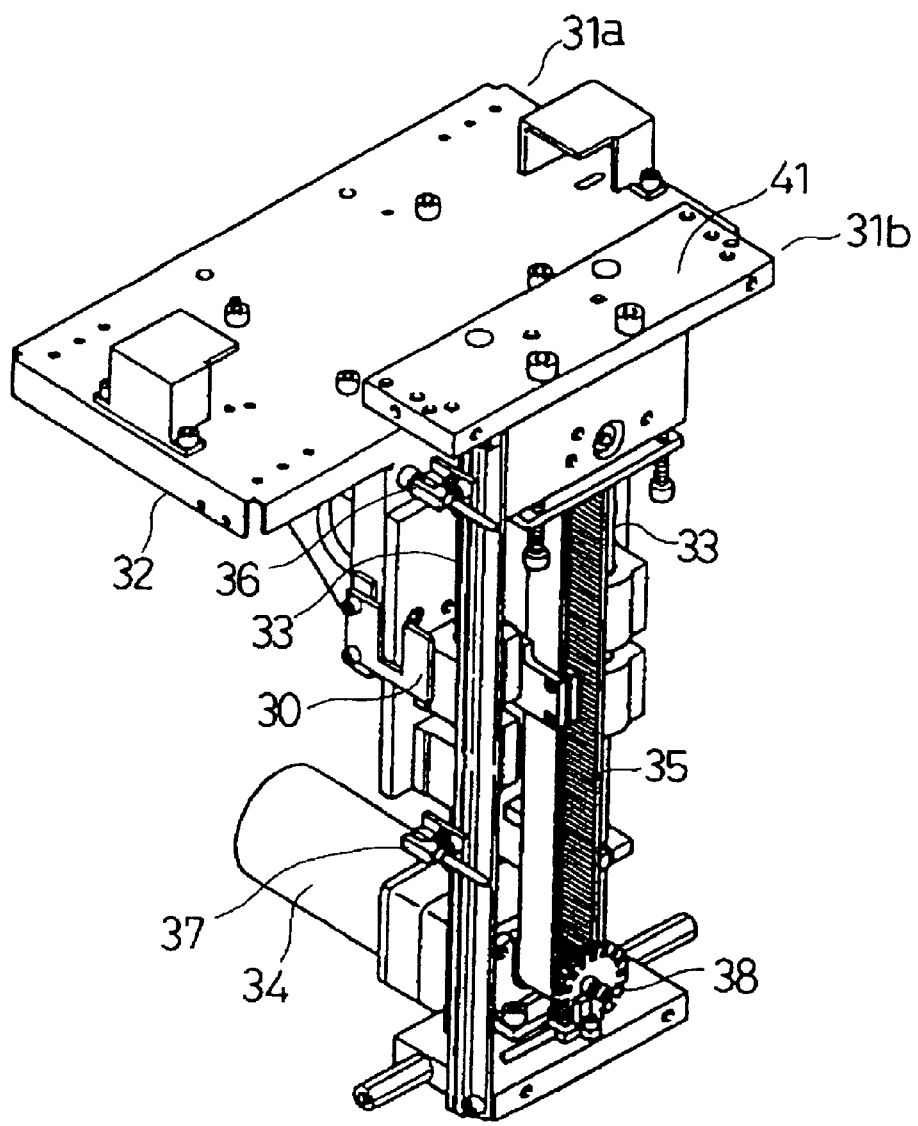
FIG. 8 is a perspective view showing an internal structure of the loader of FIG. 2.

A surface in which directions of the leaf spring 12 are changed is a horizontal surface perpendicular to a direction of gravity, as shown in FIGS. 1 to 7, and the direction of the width of the leaf spring 12 in which the leaf spring 12 resists deformation therefore points in the direction of gravity, so that droop by gravity of the fore end portion 12a protruded from the guide 24a can be prevented for ensuring stable push on a circuit board 3. As shown in FIG. 8, a lifting and lowering section 31a for lifting and lowering the storage cassettes 4 is provided on a side of the mounting machine 2 in the casing 5a of the loader 5. The pusher 13 is provided so that the base 39 extends along a space on top of a pushing section 31b adjacent to the lifting and lowering section 31a, and is supported by a stand 41.

In this state, the fore end portion 12a of the leaf spring 12 is advanced and retracted in right-angled directions from top of the base 39 toward the lifting and lowering section 31a, the tail end portion 12b is advanced and retracted along an outer side surface of the casing 5a opposite to the mounting machine 2, and a circuit board 3 stored in a step at a corresponding height in a storage cassette 4 is pushed out of the storage cassette 4 so as to be loaded into the mounting machine 2 each time the fore end portion 12a is advanced.

On condition that a hardness of the leaf spring 12 is set at on the order of 430 to 489 Hv, the life span of the leaf spring 12 can be extended because stress by the change of the directions of advancement and retraction is thereby reduced without impairment of pushing characteristics. This condition was satisfied by selection of SUS301-H as a material of the leaf spring 12; however, other materials may be employed. The hardness is not limited to the above but may be set variously according to various conditions.

On condition that a plane roughness of the side edges 12c of the leaf spring 12 is set at not more than 25 S, the life span of the spring is extended because there is little unevenness having such a size that cracks and fracture are caused by great deformation such as the bend for the change of the directions of advancement and retraction. The life span is further extended stably with the plane roughness not more than 6.3 S. On condition that a radius R of curvature of the leaf spring 12 with respect to the direction of the width shown in FIG. 6 is on the order of 30 to 50 mm, a quantity of deformation by the change of the directions of the advancement and retraction is decreased without impairment of rectilinearity, stress is thereby reduced, and the life span of the spring is extended.

The leaf spring 12 is cut from a material with a longitudinal direction of the spring set perpendicular to a drawing direction for the material. With this setting, linear pattern of indentation caused by rollers in the direction perpendicular to the drawing direction in drawing of the spring material remains on the leaf spring 12 in the longitudinal direction of the spring, directions of bending and stretching in the change of the directions of advancement and retraction of the leaf spring 12 intersect the linear pattern by the rollers, stress concentration and mechanical stress that are caused by the linear pattern in the deformation are reduced, and therefore damage to the leaf spring 12 at an early stage can be prevented. In an experiment conducted by the inventor et al., the leaf spring 12 that satisfied the above conditions and that had a thickness of 0.15 mm, a travel speed of 80 mm/sec, and a transit time for each of advancement and retraction of 4.5 sec survived a test with six hundred thousand iterations of the advancement and retraction. Without the above consideration, the life span may expire with twenty thousand iterations or so even if SUS material is selected.

The base 39 is supported on a pair of left and right support rods 42 (see FIG. 3) screwed into and fixed onto the stand 41 so that a position of the base in a direction (Y—Y) of widths of circuit boards 3 in storage cassettes 4 can be controlled with use of screws 43 and slots 44. With the position control according to a width of an edge to be pushed of a circuit board 3, a center position of the width of the edge can be pushed stably. For the position control, graduation 46 and index 47 that show a positional relation between one of the support rods 42 and the base 39 are provided on the base 39 and on the support rod 42.

Figure 3:
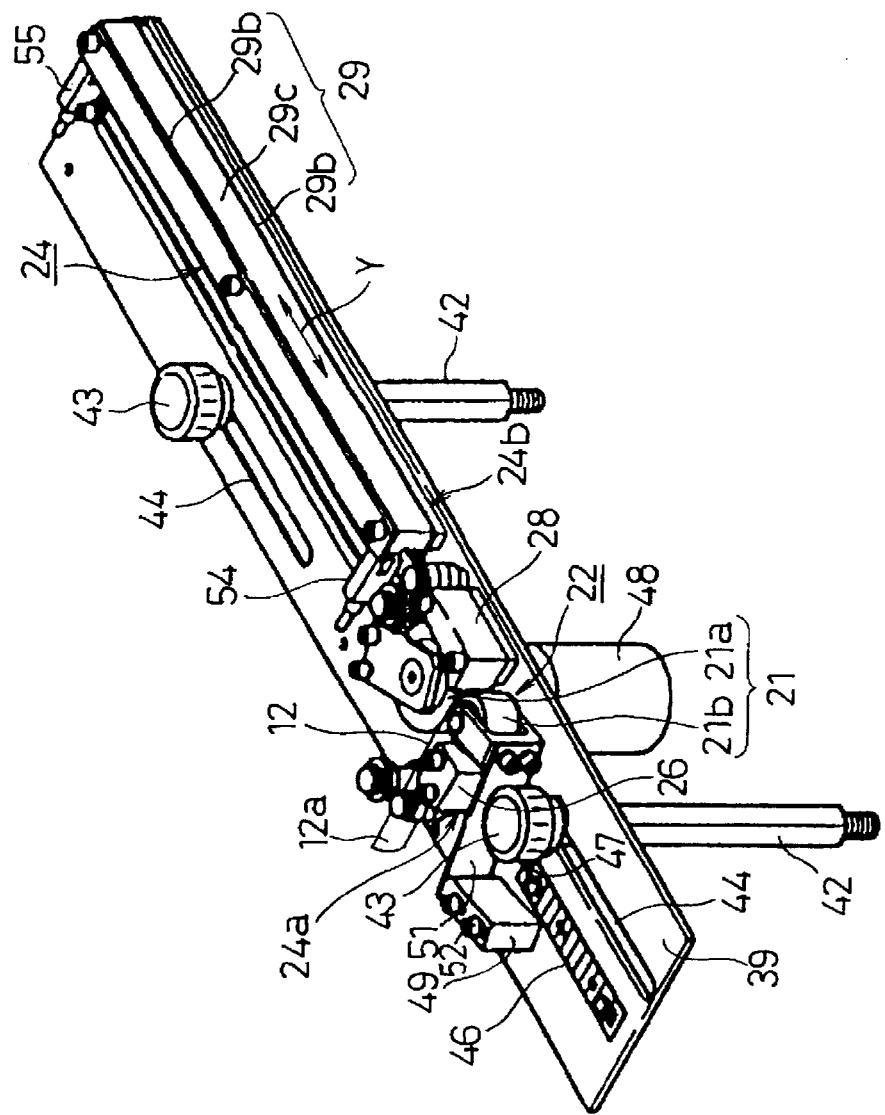
FIG. 3 is a perspective view showing a configuration of a pusher employed for the loader of FIG. 2.

With use of a space between the base 39 and the stand 41 created by the support rods 42, a servo motor 48 for driving the driving roller 21a is attached to a lower surface of the base 39 so as to drive the driving roller 21a directly. The pressure roller 21b is supported at an extremity of a leaf spring 51 of which one end is fixed to the base 39 by a block 49 as shown in FIG. 3, the pressure roller 21b is thereby brought into pressure contact with the driving roller 21a, and a pressure for the contact can be adjusted by change of a position of the block 49 secured by screws 52. Provided that the pressure roller 21b is supported by a lever member so as to be brought into pressure contact with the driving roller 21a by a coil spring or the like acting on the lever member, there is an advantage in that forces biasing the driving roller can easily be made uniform even in presence of a small difference such as individual variation in setting of the position.

On the tail end portion 12b of the leaf spring 12 is provided a flap 53 as shown in FIG. 7, the flap 53 is detected by sensors 54 and 55 such as photo sensors provided in specified positions, and an advanced position and a retracted position of the leaf spring 12 are thereby controlled when the leaf spring 12 is driven for advancement and retraction by the servo motor 48, so that a quantity of pushing required for pushing out and loading a circuit board 3 is achieved. The quantity of pushing varies with sizes of circuit boards 3 in the pushing direction and, for adapting to the variance, the sensors 54 and 55 are secured by screws 58 to the C-shaped guide rail 56 fixed onto the base 39 shown in FIG. 7 so that positions of the sensors can be adjusted along a groove 56a. The stroke of advancement and retraction, i.e., the quantity of pushing can be controlled by adjustment of the advanced position and the retracted position of the leaf spring 12 or by adjustment of at least one of those positions. Instead of the servo motor 48, other types of motors such as DC motors may be employed.

Figure 9:
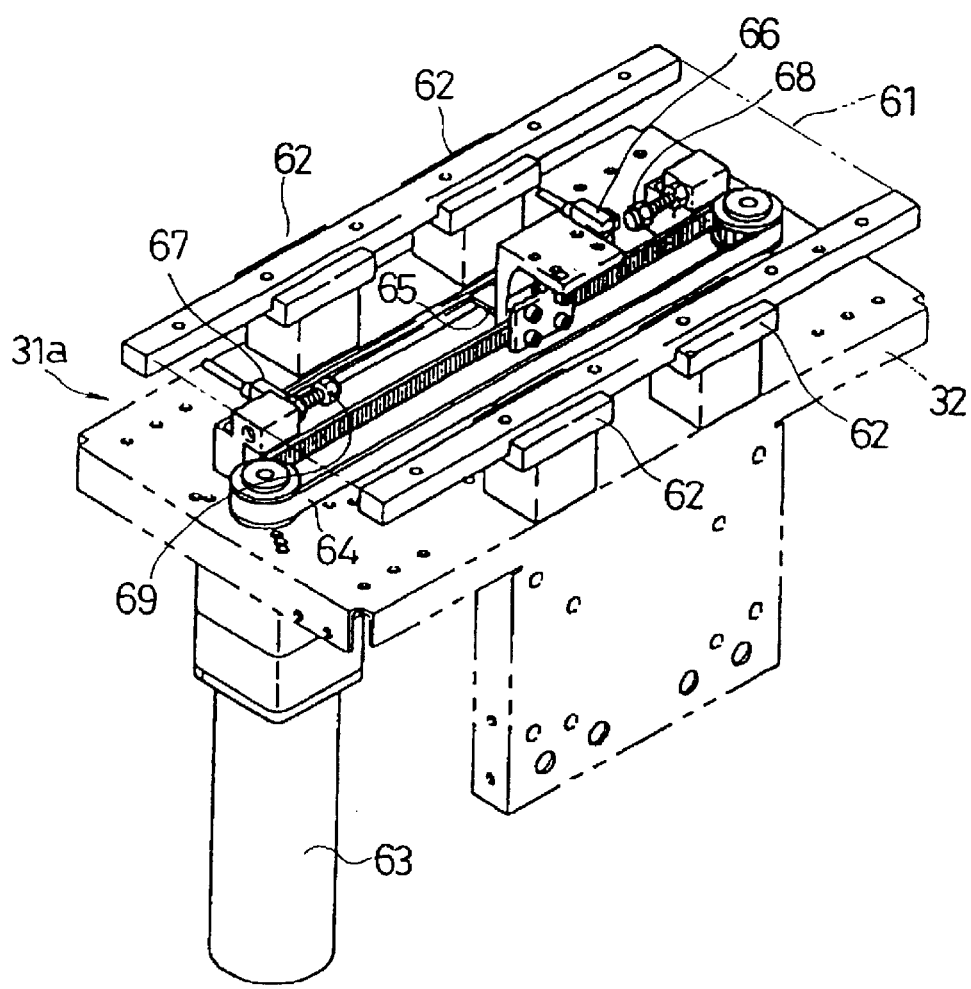
FIG. 9 is a perspective view of a lifting and lowering platform in a lifting and lowering section of the loader of FIG. 8.

The lifting and lowering section 31a lifts and lowers the storage cassettes 4 each having a plurality of steps where circuit boards 3 as an example of board-like members are stored and can be put in and out at both sides, and the steps are sequentially positioned in the pushing position for the pusher 13 so as to be subjected to pushing by the pusher 13. In the lifting and lowering section 31a, for this operation, a lifting and lowering platform 32 as shown in FIG. 9 is provided and supported so as to be lifted and lowered along a lifting and lowering guide 33 shown in FIG. 8 and provided on the stand 41, and the platform 32 is driven to be lifted and lowered, through medium of a timing belt 35 by a servo motor 34. An upper limit position and a lower limit position of the lifting and lowering platform 32 are detected by position sensors 36 and 37 such as photo couplers with use of a flap 30, so that the lifting and lowering operation exceeding the limit positions is prevented for safety. In order that steps of a storage cassette 4 may sequentially be moved up and down to a specified height subjected to pushing by the pusher 13, a rotational position of the motor is detected from time to time by an encoder mechanism 38 coupled to the servo motor 34, and the motor is intermittently driven by a pitch of arrangement of the steps of the storage cassette 4. Instead of the timing belt 35, however, other means such as ball screw may be employed, and the servo motor 34 also may be replaced by other means.

Figure 10:
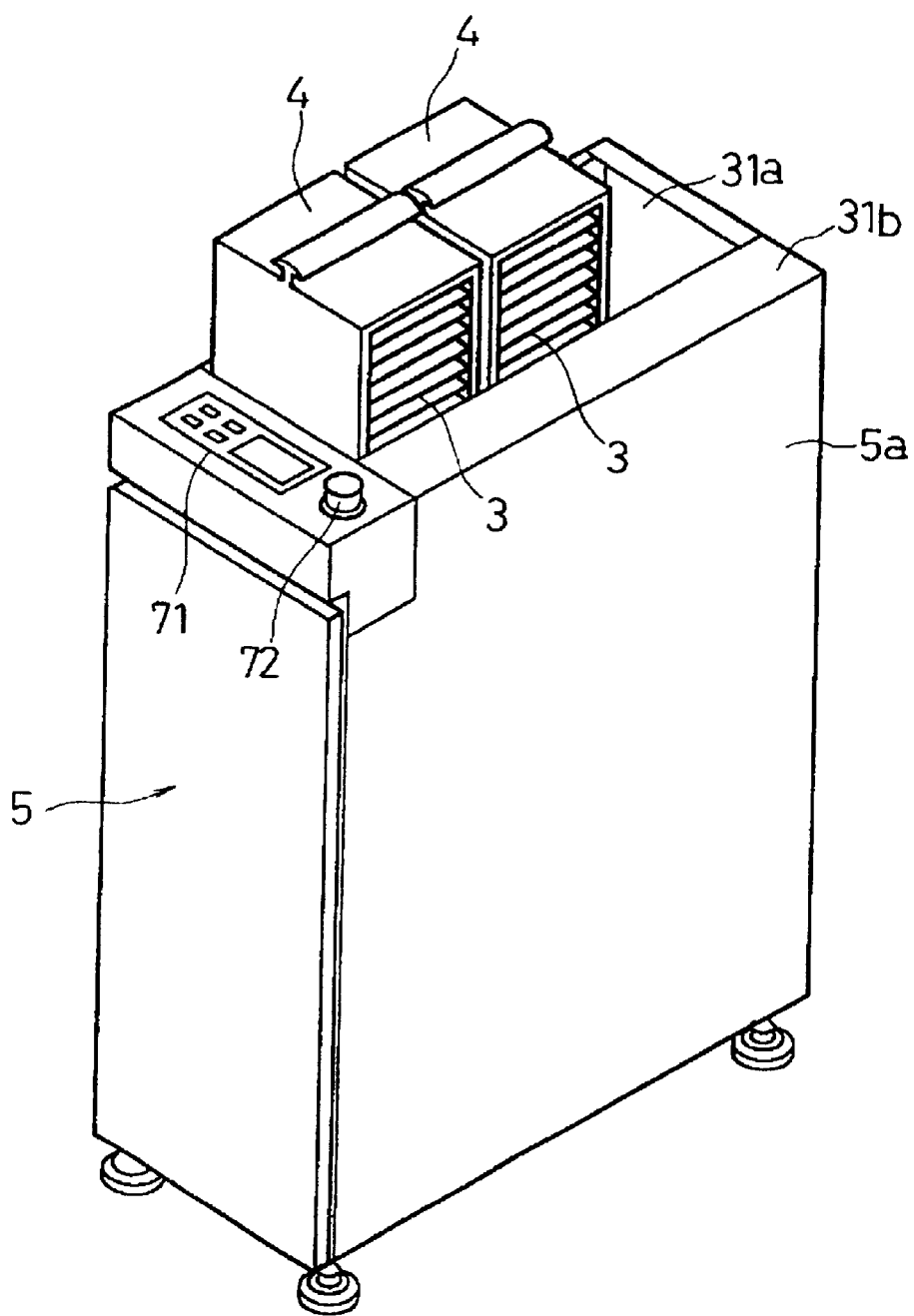
FIG. 10 is an external perspective view showing the loader of the apparatus of FIG. 1.

On the lifting and lowering platform 32, a slide base 61 shown in FIG. 9 is supported so as to be capable of moving along rectilinear-advancement guides 62 oriented in the direction Y—Y perpendicular to the direction X—X of the push by the leaf spring 12 and is reciprocated through medium of a timing belt 64 by a servo motor 63 installed on a lower surface of the platform 32, so that either of two storage cassettes 4 arranged side by side as shown in FIGS. 1, 2, and 10 can be positioned corresponding to the pushing position for the leaf spring 12. With this arrangement, one empty storage cassette 4 of two storage cassettes 4 on the platform 32 can be replaced by a cassette 4 that is not empty while the other storage cassette 4 is served for the loading of a circuit board 3. This operation substantially shortens time required for switchover of the storage cassettes 4 when feeding of circuit boards 3 from one of the storage cassettes 4 is switched over to feeding from the other. A size in the pushing direction X—X of the loader 5 having the above structure was 300 mm for a circuit board 3 having a size of 200 mm in the same direction, and was drastically decreased in comparison with a conventionally required size of 500 mm.

Two positions for the switching use of the storage cassettes 4 are obtained by control on the servo motor 63 that is based on a result of position detection by sensors 66 and 67 with use of a flap 65. Excessive travel of the slide base is prevented by stoppers 68 and 69. The loader 5 operates from beginning of the drive to termination of the drive, under a controller for the mounting machine 2 that functions as a host controller and, as shown in FIG. 10, the loader 5 has a display panel 71 for displaying operating condition and the like of the loader and a stop key 72 for stopping the loader independently or stopping the loader together with the mounting machine 2 and the unloader 7, in an emergency.

Figure 17A:
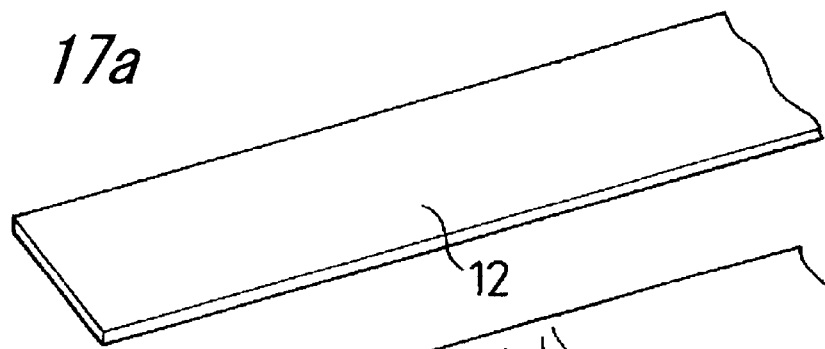
FIGS. 17a to 17h are views showing modifications of a leaf spring of the pusher.
Figure 17B:
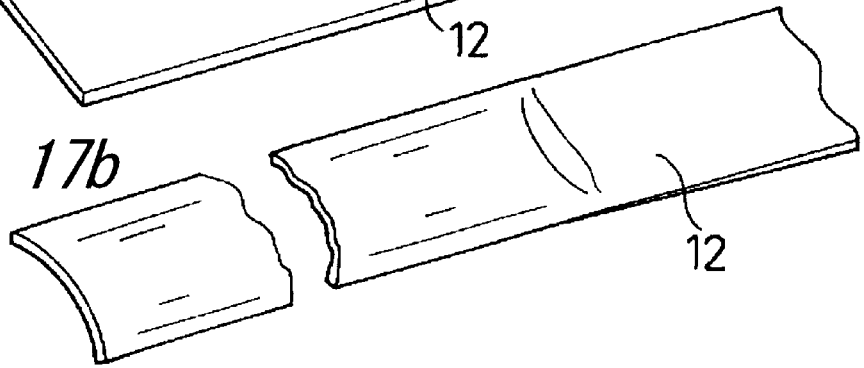
Figure 17C:
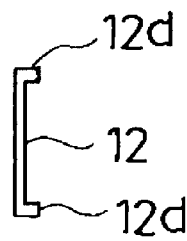
Figure 17F:
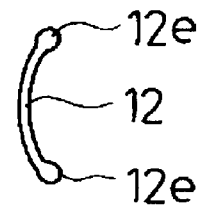
Figure 17D:
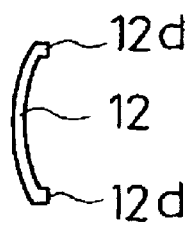
Figure 17G:
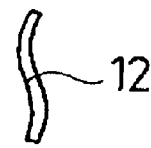
Figure 17E:
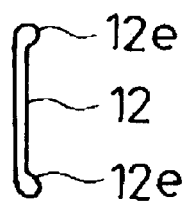
Figure 17H:
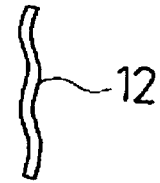

In accordance with the above description, the leaf spring 12 of the pusher 13 is curved with respect to the direction of the width of the spring. For achievement of a flexural rigidity that satisfies a required rectilinearity, however, the leaf spring 12 may adopt various manners of materials, thicknesses, thickness distributions along the direction of the width, bending shapes other than the shape curved with respect to the direction of the width, and the like. For example, the invention is still effective even if a leaf spring 12 shaped like a flat plate as shown in FIG. 17a is provided. Other available forms include a form provided with bent pieces 12d on both side edges as shown in FIG. 17c, a form in which a curve with respect to a direction of a width and bent pieces 12d are combined as shown in FIG. 17d, a form provided with thick portions 12e on both side edges of a leaf spring 12 as shown in FIG. 17e, a form in which a curve with respect to a direction of a width and thick portions 12e are combined as shown in FIG. 17f, and forms in which an appropriate number of corrugated shapes are contiguous in a direction of a width as shown in FIGS. 17g and 17h.

In other words, it does not matter basically how a form of the leaf spring 12 is, as long as a flexural rigidity that satisfies rectilinearity of the leaf spring 12 is achieved. Nevertheless, a characteristic that makes possible the advancement and retraction with the change of the directions of the spring is required in addition to the rectilinearity. As long as these characteristics are satisfied, various materials that are known or will be developed may be applied even if the materials are not metal. The rectilinearity of the leaf spring 12 of the pusher 13 is required only in a range S shown in FIG. 17b a little longer than a portion that is to protrude to be free, from the pair of guide rollers 25 and the like as final guiding means, and the rectilinearity required for the pusher 13 has only to be satisfied in the range S. Therefore, the curve with respect to the direction of the width shown in the drawings or the shapes shown in FIG. 17a and FIGS. 17c to 17h have only to be provided in the range S.

For the pair of rollers 21 that constitute the direction changing section 22 may be substituted a pair of guides or a combination of a roller and a guide. The same applies to other pairs of rollers. Surfaces of the rollers and the guides that are to be brought into contact with the leaf spring 12 are preferably shaped so as to fit a surface shape of the leaf spring 12. Guiding such both side edges as shown in FIGS. 17c to 17f that have particularly high rigidities is preferably avoided.

For the pair of driving rollers 21a that constitute the driving section may be substituted means other than rollers. For example, means that nips and holds the leaf spring may be reciprocated in the directions of advancement and retraction of the leaf spring, and any means capable of moving the leaf spring in the directions of advancement and retraction will do.

Figure 13:
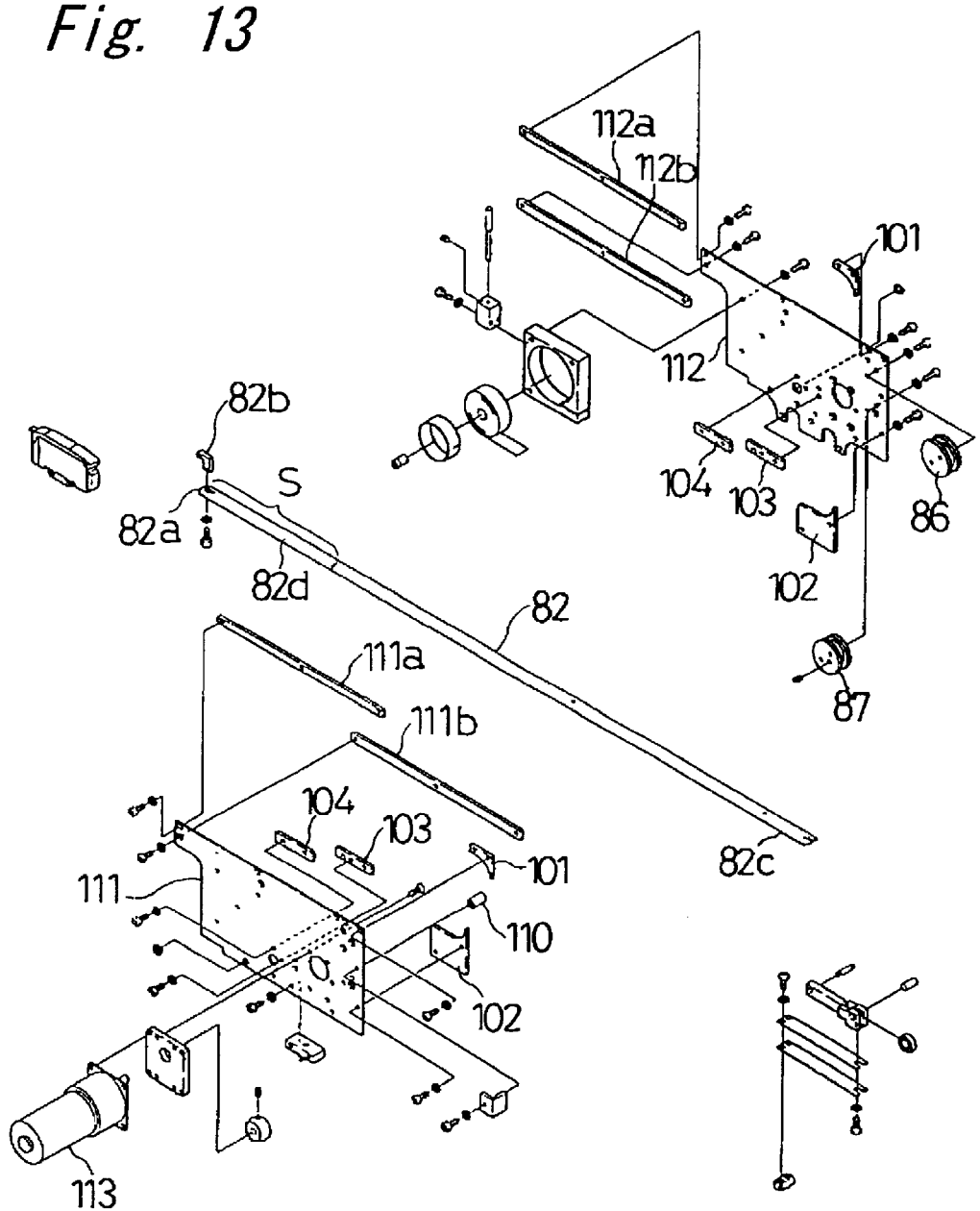
FIG. 13 is an exploded perspective view of the puller of FIG. 11.
Figure 14:
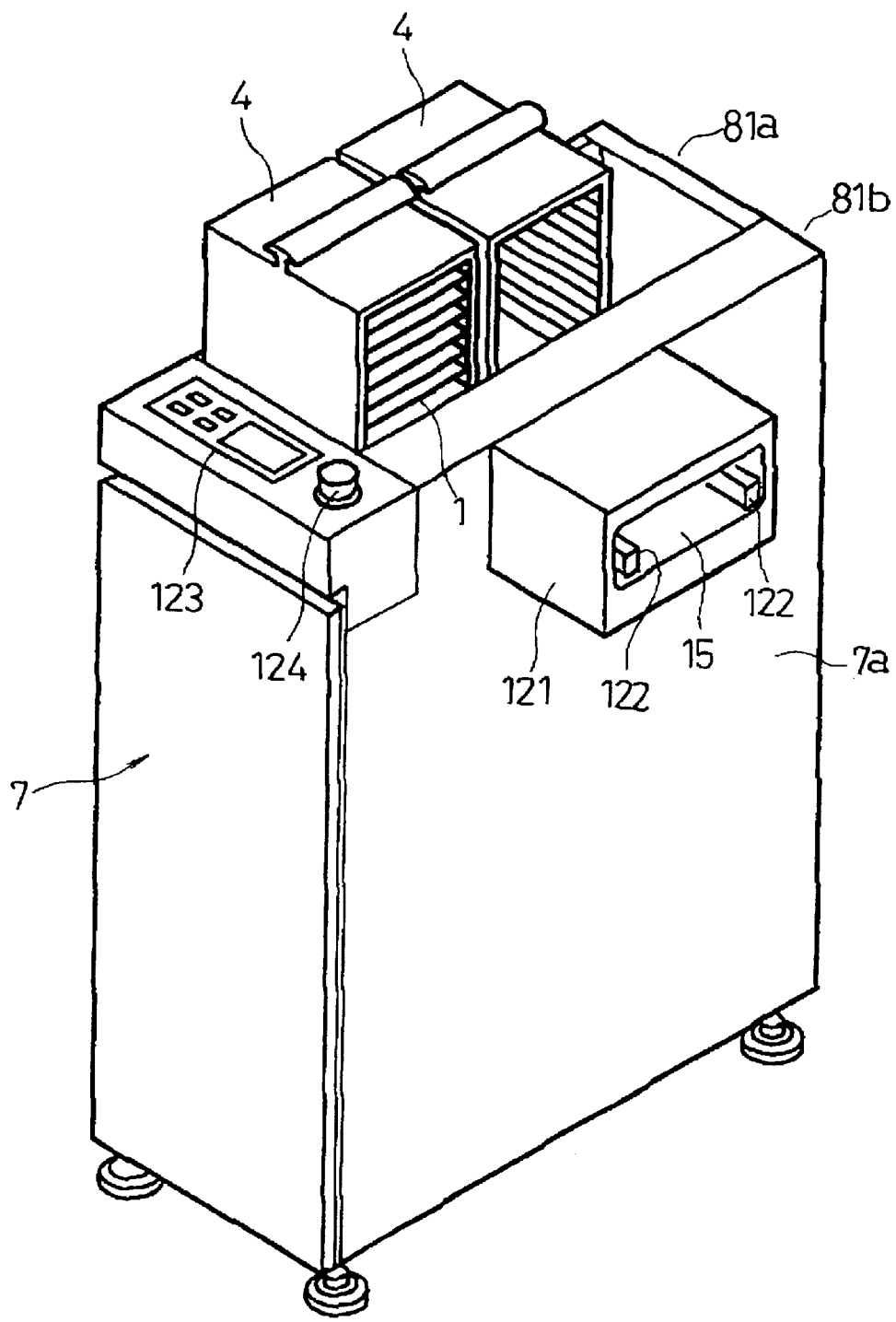
FIG. 14 is an external perspective view of the puller of FIG. 11.
Figure 15:
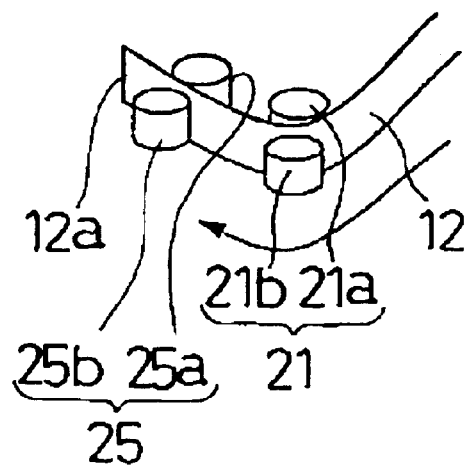
FIG. 15 is a schematic view showing an action of the pusher.
Figure 16:
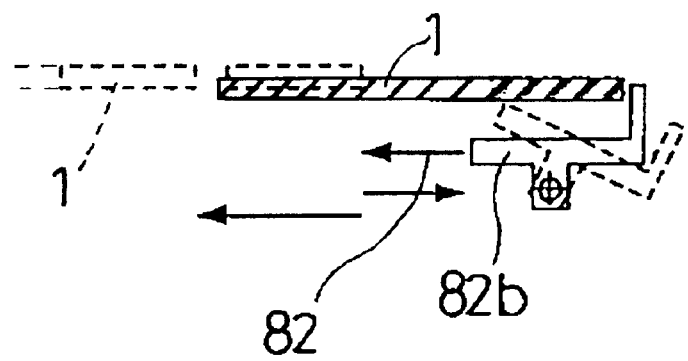
FIG. 16 is a schematic view showing an action of the puller.

As shown in FIGS. 1 and 14, the unloader 7 has a lifting and lowering section 81a that lifts and lowers storage cassettes 4 where electronic circuit boards 1 as an example of board-like members can be stored in a plurality of steps and can be put in and out at both sides, and has a pulling section 81b that pulls out of the mounting machine 2 an electronic circuit board 1 mounted with specified electronic components 6 in the mounting machine 2 as a handling section for handling electronic circuit boards 1 and that pulls the electronic circuit board 1 into a step at a specified height in a storage cassette 4 placed on the lifting and lowering section 81a. The pulling section 81b employs the puller 15 as shown in FIG. 1, FIGS. 11 to 14 and FIG. 16. Between a pair of side plates 111 and 112 shown in FIGS. 11 and 13, the puller 15 has a flat leaf spring 82, a driving section 84 that nips the leaf spring 82 between a pair of driving rollers 83 to advance and retract the spring in a longitudinal direction and that thereby causes pull of an electronic circuit board 1, as an object to be pulled, hooked by a hooking piece 82b on a fore end portion 82a each time the fore end portion 82a is retracted, at least one unit of direction changing section 85 that bends a side of a tail end portion 82c of the leaf spring 82 being advanced and retracted with respect to a side of the fore end portion 82a extending in a pulling direction and that thereby changes directions of the advancement and retraction, and guides 80 that guide the side of the fore end portion 82a and the side of the tail end portion 82c of the leaf spring 82 divided by the direction changing sections 85 in the directions of the advancement and retraction. The pair of side plates 111 and 112 are connected to each other through spacers 110 at a plurality of positions. The hooking piece 82b has a shape and a size suitable for pulling an electronic circuit board 1, is made from synthetic resin, and is fixed to the fore end portion 82a by screws or the like.

The leaf spring 82 is flat but has a high flexural rigidity, and therefore drive for the advancement and retraction by the driving section 84 is satisfactorily transmitted to the fore end portion 82a. In particular, an extensional rigidity of the leaf spring 82 is so high that pull of retraction drive by the driving section 84 is efficiently transmitted to the fore end portion 82a directly or through the guides 80, the direction changing sections 85, and the like. With such characteristics, an electronic circuit board 1 in an initial pull position shown in FIG. 16 can be pulled reliably without play and loss.

A distance from a terminal position of the pull to the direction changing sections 85 can be set smaller than a quantity of pull from the initial pull position to the terminal pull position, irrespective of the quantity of the pull, on a necessary minimum condition that the direction changing sections 85 can be provided. Even if a guide 80b on the side of the fore end portion 82a divided by the pair of driving rollers 83 is provided so as to extend to the initial pull position, a maximum quantity of advancement of the leaf spring 82 can be restricted so as to be roughly as small as the quantity of pull because the hooking piece 82b on the fore end portion 82a of the leaf spring 82 has only to hook an electronic circuit board 1 in a range from the initial pull position to the terminal pull position. As a result, a size of projection of the puller can be minimized according to the quantity of pull, for space saving.

On condition that the side of the tail end portion 82c of the leaf spring 82 defined by the pair of driving rollers 83 is bent to a side having the more room of an installation area for the unloader 7 and the like, problems such as obstruction to other equipment and expansion of the installation area on a side opposite to a direction of the bend are prevented.

The pair of driving rollers 83 is composed of a driving roller 83a and a pressure roller 83b in pressure contact with the roller 83a. By the same reason as for the pair of driving rollers 21 of the pusher 13, the pressure roller 83b is an elastic roller made from urethane and the driving roller 83a is a metal roller. The leaf spring 82, which is like a flat plate having no bent portion except the fore end portion, can smoothly be driven for advancement and retraction. Besides, the leaf spring 82 is resistant to sliding and therefore a rectilinear portion of the leaf spring 82 is driven. As shown in FIG. 12, the direction changing sections 85 are provided in three places in total, i.e., guide rollers 86 and 87 as the first and the second and a winding mechanism 88 as the third, and drive the leaf spring 82 for the advancement and retraction in a course that is shaped like a bracket and that is curved to such an extent that no stress is caused. The side of the tail end portion 82c that is drawn out and advanced from the winding mechanism 88 against bias of a winding spring 89 and that becomes a surplus when retracted is wound on a winding drum 88a of the winding mechanism 88 so as not to be obstructive.

Figure 11:
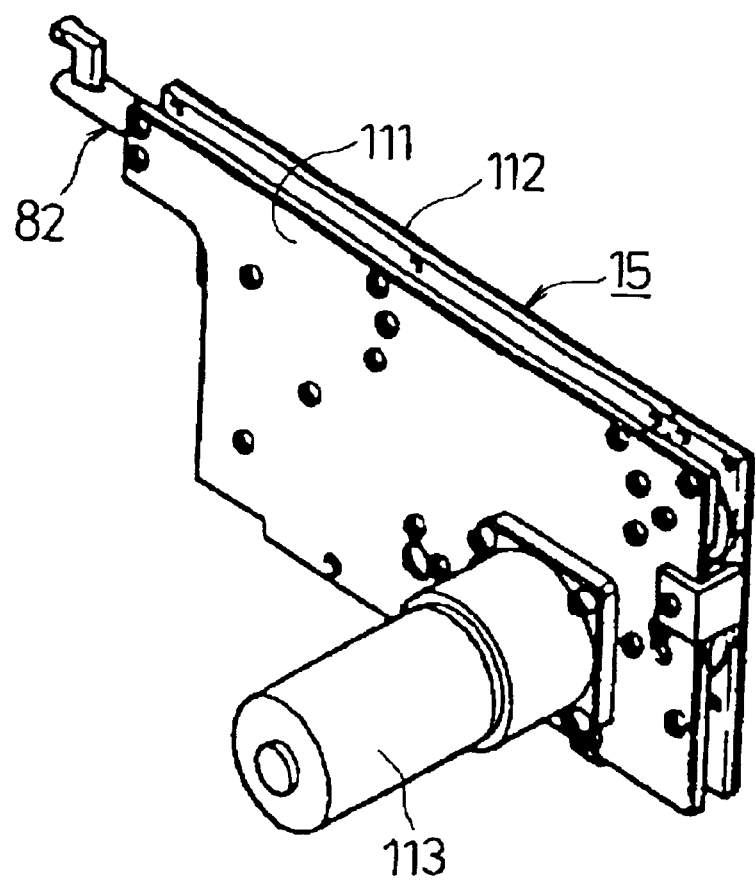
FIG. 11 is a perspective view of a puller employed for an unloader of the apparatus of FIG. 1.

A surface in which the directions of the leaf spring 82 are changed is vertical as shown in FIGS. 11 and 13, and therefore required component members can be arranged with use of a dead space in the vertical surface in a casing 7a of the unloader 7, for the purpose of saving horizontal space. The provision of three direction changing sections 85 as shown in the drawings allows the space for arrangement of the required component members to be made still smaller.

The pair of driving rollers 83 are provided between the second guide roller 87 and the winding mechanism 88, and a guide roller 91 that prevents the leaf spring 82 from bulging outward and that is paired with an inside guide roller 90 for preventing shake is provided between the first and the second guide rollers 86 and 87.

In addition to the guide rollers 86 and 87, as shown in FIGS. 12 and 13, the guide 80a has fixed guides 101 and 102 facing the rollers 86 and 87 and provided so as to guide outside of the leaf spring 82, the guide rollers 91 and 90, a fixed guide 103 for preventing shake that guides inside of the leaf spring 82 between the driving roller 83a and the guide roller 87, and a rectilinear-advancement guide 104 that guides the side of the fore end portion 82a of the leaf spring 82 extending from the guide roller 86 and the fixed guide 101. The rectilinear-advancement guide 104 is composed of a pair of upper and lower rail members 111a and 111b and a pair of upper and lower rail members 112a and 112b that are fixed by screws or the like to inside surfaces of the side plates 111 and 112, and the guide 104 guides both the side edges of the leaf spring 82 in grooves 111c and 112c defined by those members and shown in FIG. 12. The fixed guide 102 is sized so as to face the fixed guide 103. In the embodiment shown in FIG. 13, the upper rail members 111a and 112a and the fixed guide 101 are configured with use of separate members; however, seamless integration of those elements as shown in FIG. 12 reduces slide friction, scratch and the like between the leaf spring 82 and the elements and improves durability of the leaf spring 82.

As shown in FIGS. 12 and 13, the guide 80b has a fixed guide 105 for shake prevention that guides the leaf spring 82 from inside between the driving roller 83a and the winding mechanism 88, and a fixed guide 106 for shake prevention that faces the fixed guide 105 and that guides the leaf spring 82 from outside as shown in FIG. 12 may be provide as shown by an imaginary line. On surfaces of the fixed guides 101 to 103, 105, and 106 that are in slide contact with the leaf spring 82, Teflon coating layers 114 are provided to reduce slide friction with the leaf spring 82. With employment of rollers as those guides, however, such consideration becomes unnecessary. The advantage of rollers as the fixed guides is the same as in the pusher 13.

As is the case with the pusher 13, the guides 80a and 80b as described above have a guiding function that allows the leaf spring 82 drawn out from the winding mechanism 88 to be taken out from the side of the fore end portion 82a and inserted, and thus the leaf spring 82 can easily be replaced. Complexity of the structures of the guides for shake prevention in comparison with that in the pusher 13 corresponds to shakiness of the flat leaf spring 82, and employment of a leaf spring curved with respect to a direction of width in the same manner as the leaf spring 12 of the pusher 13 reduces or removes necessity of such consideration.

The driving roller 83a is driven directly by a DC motor 113 secured to an outside surface of the side plate 111 by screws or the like, and drive for advancement and retraction of the leaf spring 82 is controlled with position detection by sensor mechanism not shown so that a required pull stroke is obtained. Alternatively, a motor other than the DC motor may appropriately be used.

The pressure roller 83b of the pair of driving rollers 83 is supported at an extremity of a lever member 93 that is pivotable about a shaft 92 as shown in FIG. 12, the roller 83b is brought into pressure contact with the driving roller 83a by a bias of a coil spring 95 acting between the lever and a spring shoe 94 fixed by screws or the like, and such a structure reduces individual variation in setting of the pressure. Nevertheless, the pair of driving rollers 83 may also perform as the direction changing section 85, and position of the rollers does not matter particularly. In the case that elongation of the leaf spring 82 is a problem, the position of the rollers near to the fore end portion 82a is advantageous. In addition, such position setting reduces a required length of the leaf spring 82.

The direction changing sections 85 are provided as the guide rollers 86 and 87, rotation of the guide rollers 86 and 87 with movement of the leaf spring 82 prevents slide friction between the leaf spring 82 and the direction changing sections, and the drive for advancement and retraction of the leaf spring 82 with the change of directions is performed without strain. In contrast to a fixed guide, the guide roller 91 rotates with movement of the leaf spring 82 and therefore does not involve scrape and accumulation of dirt from a surface of the leaf spring 82. On condition that dirt still adheres to and accumulates on the guide roller 91, automatic cleaning may be executed with a cleaning roller 193 shown in the drawings and/or cleaning web of winding type not shown in contact with the roller 91.

The side of the tail end portion 82c of the leaf spring 82 is connected to and wound in the winding mechanism 88 as described above, and a space required for handling of a length of the leaf spring 82 can be reduced by a size of the wound portion. Provided that the winding mechanism 88 is made to also perform as the direction changing sections 85 by substitution of the winding mechanism 88 for the second guide roller 87 of the direction changing sections 85 shown in the drawings, substitution of the pair of driving rollers 83 for the first guide roller 86, and the like, maximal simplification of structure, further miniaturization and cost reduction are achieved.

On condition that a hardness of the leaf spring 82 is on the order of 370 to 429 Hv a little lower than that of the leaf spring 12, suppression of stress and prolongation of life span of the spring are achieved though there are two direction changing sections 85 and though the spring is wound by the winding mechanism 88. Such a condition is satisfied in the case that material of the leaf spring 82 is SUS301-3/4H; however, SUS301-H may be used. These materials are not limitative and other materials may be used. Depending on various conditions, the hardness may be set at values other than the above. A roughness of the side edges of the leaf spring 82 equal to or less than 25 S is preferable by the same reason as in the pusher 13, and a radius of curvature with respect to the direction of the width of the leaf spring 82 on the order of 20 to 50 mm provides a rectilinear rigidity required for pull without use of the guides 80, without reducing durability. As the radius approaches 20 mm, a length of a portion that can be omitted of the guide 80a forms an increasing proportion of a full length of the guide 80a and a space for fixation and installation of the puller can be made small to that extent. In an experiment by the inventor et al. in which other conditions were the same as those for the pusher 13, durability of the leaf spring 82 was on approximately the same level as that of the leaf spring 12.

The guide 80a, specifically, the rectilinear-advancement guide 104 shown in FIG. 12 is configured so as not to reach an advanced position of the leaf spring 82 that is shown by an imaginary line in FIG. 12, and the side of the fore end portion 82a that protrudes from the guide 80a with advancement of the leaf spring 82 has a curved portion 82d that is curved with respect to the direction of the width and that extends over a length range S longer than the protruded portion. When the side of the fore end portion 82a of the leaf spring 82 arranged in such a manner is protruded from the guide 80a, the fore end portion 82a without aid of the guide 80a can be hooked reliably on an electronic circuit board 1 without escape and can be pulled because the side of the fore end portion 82a ranging from a portion that is guided by the guide 80a to the fore end portion 82a that is an end of the protrusion is the curved portion 82d curved with respect to the direction of the width and having a high flexural rigidity and an excellent rectilinearity. Moreover, a quantity of fixed projection of the guide 80a can be made smaller than the quantity of pull by a distance between the guide 80a and the advanced position of the leaf spring 82.

The unloader 7 has a lifting and lowering mechanism similar to that of the loader 5, in the lifting and lowering section 81a on the side of the casing 7a opposite to the mounting machine 2. In the pulling section 81b on a side of the lifting and lowering section 81a near the mounting machine 2 is housed a base in which the DC motor 113 of the puller 15 is installed. The casing 7a is shaped like a rectangular parallelepiped, and the fore end portion 82a of the leaf spring 82 together with a pair of left and right receiving rails 122 is covered in a sleeve cover 121 of which an extremity where the fore end portion 82a resides projects locally from the casing 7a. With this structure, a size of the casing 7a in the pulling direction is 300 mm for an electronic circuit board 1 having a size of 200 mm in the same direction, and is decreased in comparison with sizes of conventional structures. Besides, a quantity of projection of the sleeve cover 121 from the casing 7a can be made sufficiently smaller than the size of the electronic circuit board 1 of 200 mm.

The unloader 7 operates from beginning of the drive to termination of the drive, under the controller for the mounting machine 2 that functions as a host controller and, as shown in FIG. 14, the unloader 7 has a display panel 123 for displaying operating condition and the like of the unloader and a stop key 124 for stopping the unloader independently or stopping the unloader together with the mounting machine 2 and the loader 5, in an emergency.

In accordance with the above description, the leaf spring 82 of the puller 15 may be curved with respect to the direction of the width over a full length of the spring in the same manner as the leaf spring 12 of the pusher 13 described above. For achievement of a flexural rigidity that satisfies a required rectilinearity, similarly, the leaf spring 82 may adopt various manners of materials, thicknesses, thickness distributions along the direction of the width, bending shapes other than the shape curved with respect to the direction of the width, and the like. For example, shapes similar to those of the leaf spring 12 shown in FIG. 17a and FIGS. 17c to 17h may be adopted. A range to which such shapes are applied dose not have to be the full length and may be limited to the range S shown in FIGS. 12 and 13, which is sufficient.

In other words, it does not matter basically how a form of the leaf spring 82 is, as long as a flexural rigidity that satisfies the rectilinearity of the leaf spring 82 is achieved. Nevertheless, characteristics that make possible the advancement and retraction with the change of the directions of the spring are required in addition to the rectilinearity. As long as these characteristics are satisfied, various materials that are known or will be developed may be applied even if the materials are not metal.

For the pair of rollers 86, 87 that constitute the direction changing section 85 may be substituted a pair of guides or a combination of a roller and a guide. The same applies to other pairs of rollers. For the pair of driving rollers 83 that constitute the driving section may be substituted means other than rollers. For example, means that nips and holds the leaf spring may be reciprocated in the directions of advancement and retraction of the leaf spring. Surfaces of the rollers and the guides that are to be brought into contact with the leaf spring 82 are preferably shaped so as to fit a surface shape of the leaf spring 12. Guiding such both side edges as shown in FIGS. 17c to 17f having particularly high rigidities is preferably avoided.

The mounting machine 2 handles, as electronic components 6, semiconductor devices such as flip chips that are to be handled in a clean room, and the working apparatus is composed of the mounting machine 2 combined with the loader 5 and the unloader 7 as shown in FIG. 1. A circuit board 3 pushed out of a storage cassette 4 by the loader 5 is loaded into a take-in section 131 of the mounting machine 2, then delivered into a positioning section 132 for positioning and subjected to mounting of electronic components 6, and an electronic circuit board 1 produced with mounting with the electronic components 6 is delivered to a carry-out section 133 and is brought onto the receiving rails 122 of the unloader 7. The electronic circuit board 1 brought onto the receiving rails 122 is pulled and stored into a storage cassette 4 by the unloader 7. With use of the loader 5 and the unloader 7 having the above characteristics, handling by the mounting machine 2 circuit boards 3 stored in the plurality of steps in the storage cassettes 4, mounting the boards with electronic components 6, and storing mounted electronic circuit boards 1 into the plurality of steps in the storage cassettes 4 can be repeated automatically, while space saving of the whole apparatus including the loader 5 and the unloader 7 is achieved.

For this mounting operation, the mounting machine 2 has a component feeding section 136 that feeds required electronic components 6 each time with use of a component storage cassette 135 stored with a number of types of numerous carrying bodies 134 carrying electronic components 6 as various semiconductor devices type by type, and a mounting head 138 that picks up an electronic component 6 fed as necessary from the component feeding section 136, by a component handling tool 137 such as a suction nozzle, causes the component to face a specified position on the positioned circuit board 3, applies ultrasonic vibration thereto, and makes friction joint between metal junctions such as metal bumps on both for mounting. The mounting head 138 is moved in two directions X and Y orthogonal to each other by an X-axis table 141 and a Y-axis table 142, then selectively picks up a necessary electronic component 6 from components 6 fed by the component feeding section 136, and mounts the electronic component 6 picked up, on a required and selected position on the positioned circuit board 3. On a front part of the mounting machine 2 is an operation panel 143, and on top of the machine 2 are a main monitor 144, a sub-monitor 334 that displays guidance on operation, messages under abnormal conditions, and the like, a warning light 335 that displays normality and various forms of abnormality by different colors, and others. Nevertheless, a method of mounting or attaching electronic components 6 by the mounting machine 2 does not matter particularly, and application may be made to other various operations and handling.

Second Embodiment

A second embodiment shown in FIGS. 18 to 32 differs from the first embodiment in that a pusher 13 and a puller 15 are made to have a common mechanism except for a part thereof.

Figure 18:
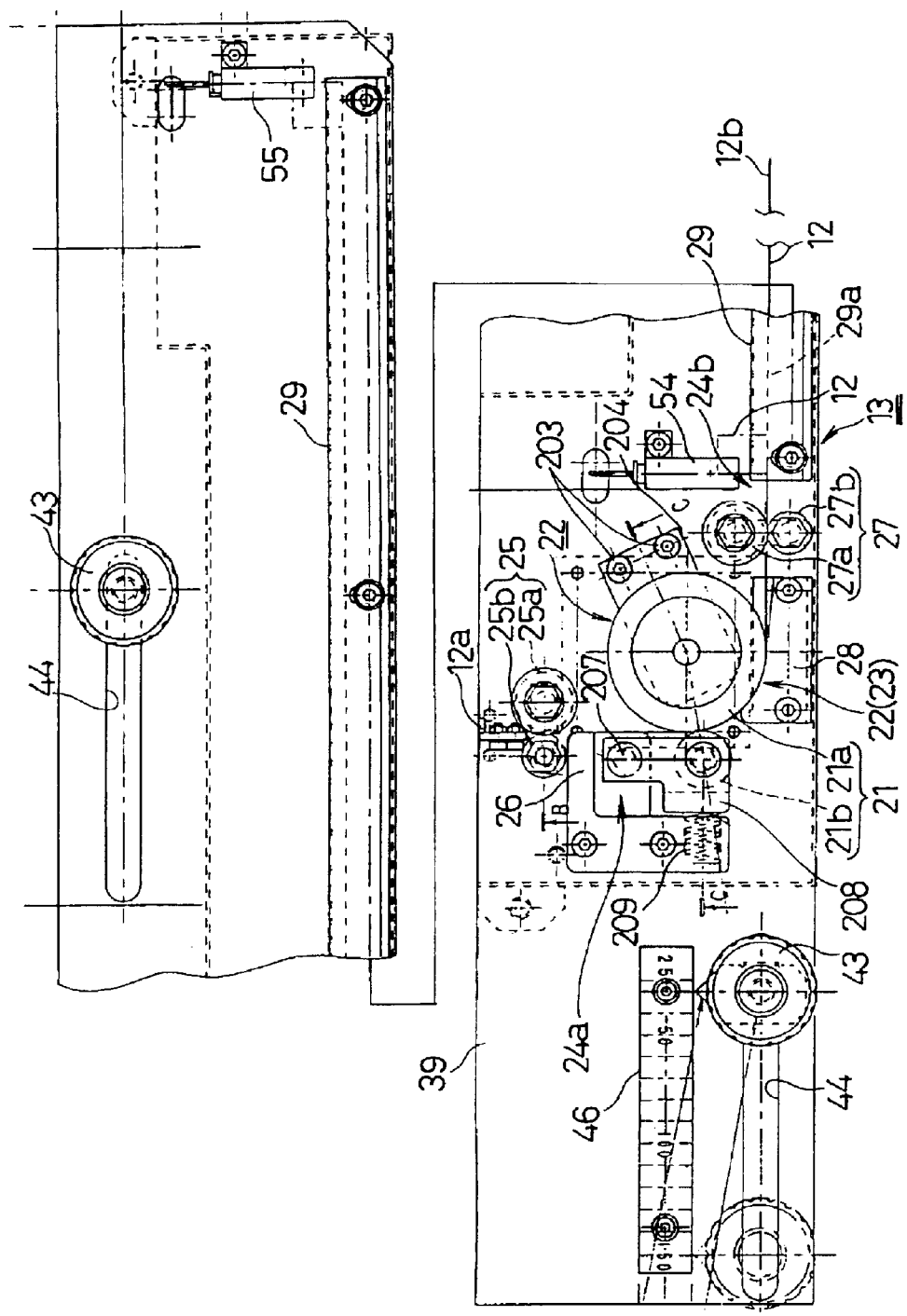
FIG. 18 is a plan view showing a pusher in accordance with a second embodiment of the invention.
Figure 19:
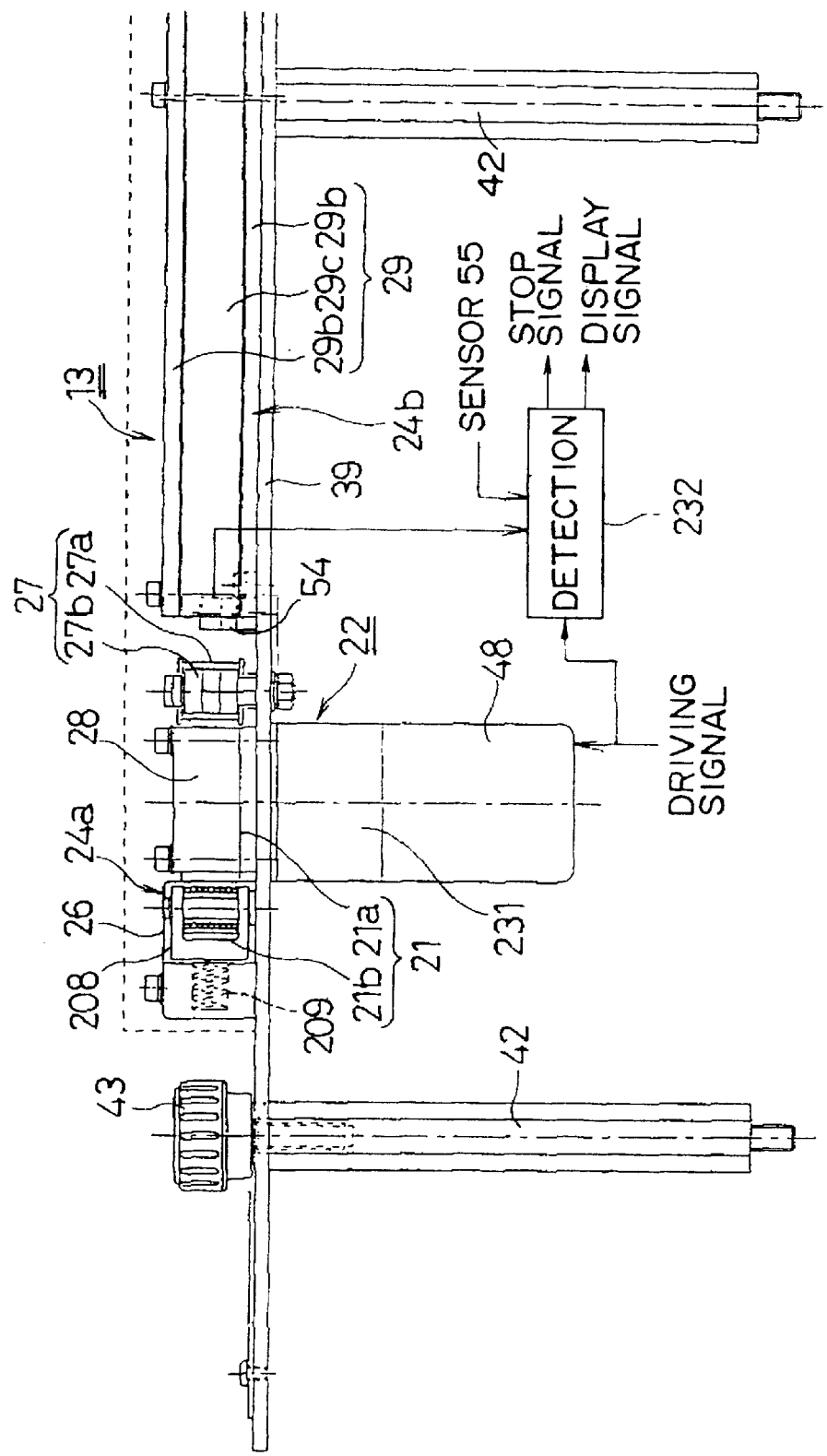
FIG. 19 is a side view of a main part of the pusher of FIG. 18.
Figure 20:
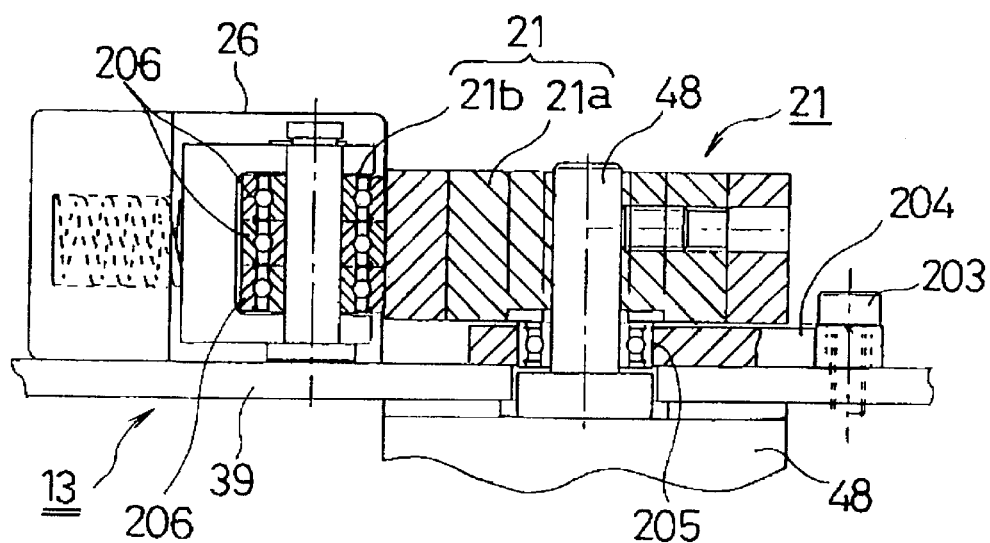
FIG. 20 is a sectional view of a pair of driving rollers of FIG. 19.

As shown in FIGS. 18, 19, and 20, the pusher 13 has a configuration that is almost the same as that in the first embodiment, and therefore common members will be designated by the same numerals as the above and duplicate description will be omitted. Hereinbelow, different points will be described. A motor shaft 48a of a motor 48 connected directly to a driving roller 21a of a pair of driving rollers 21 is supported through medium of a bearing 205 by a support board 204 fixed onto an upper surface of a base 39 by a bolt 203, so that the driving roller 21a stably rotates with less runout and with a small rotational resistance, and so that a leaf spring 12 is reliably advanced and retracted with stable direction change between the driving roller 21a and a pressure roller 21b. The pressure roller 21b is composed of a stack of a plurality of bearings 206 so that rotational resistance is minimized for smooth advancement and retraction of the leaf spring 12. The pressure roller 21b is supported at an extremity of a lever 208 supported pivotably on a fixed guide 26 by a hinge pin 207, and the pressure roller 21b is brought into pressure contact with the driving roller 21a by a coil spring 209 provided between the lever 208 and the fixed guide 26.

Figure 21:
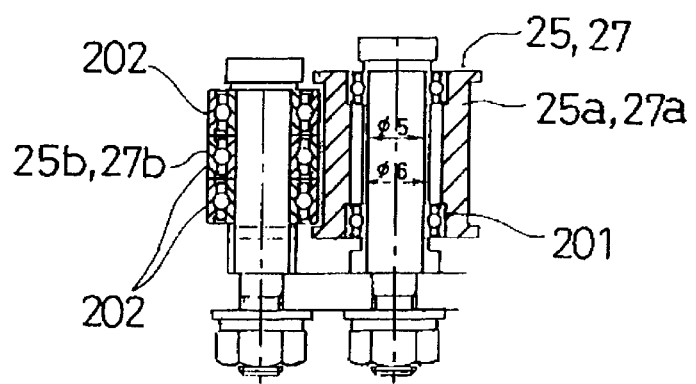
FIG. 21 is a sectional view of a pair of guide rollers of FIG. 19.

In a pair of guide rollers 25, 27, as shown in FIG. 21, one roller 25a, 27a is a cylindrical roller with brims that is supported with bearings 201, and the other roller 25b, 27b is a cylindrical roller that is a stack of a plurality of bearings 202 and that has a length such that the roller 25b, 27b comes between the brims of the roller 25a, 27a with play. With this arrangement, the pair of guide rollers 25, 27 receive the leaf spring 12 in a gap defined by the rollers and shaped like a bracket and guide the spring without fallout and offset, and the leaf spring 12 advances and retracts smoothly with minimized rotational resistance.

Figure 22:
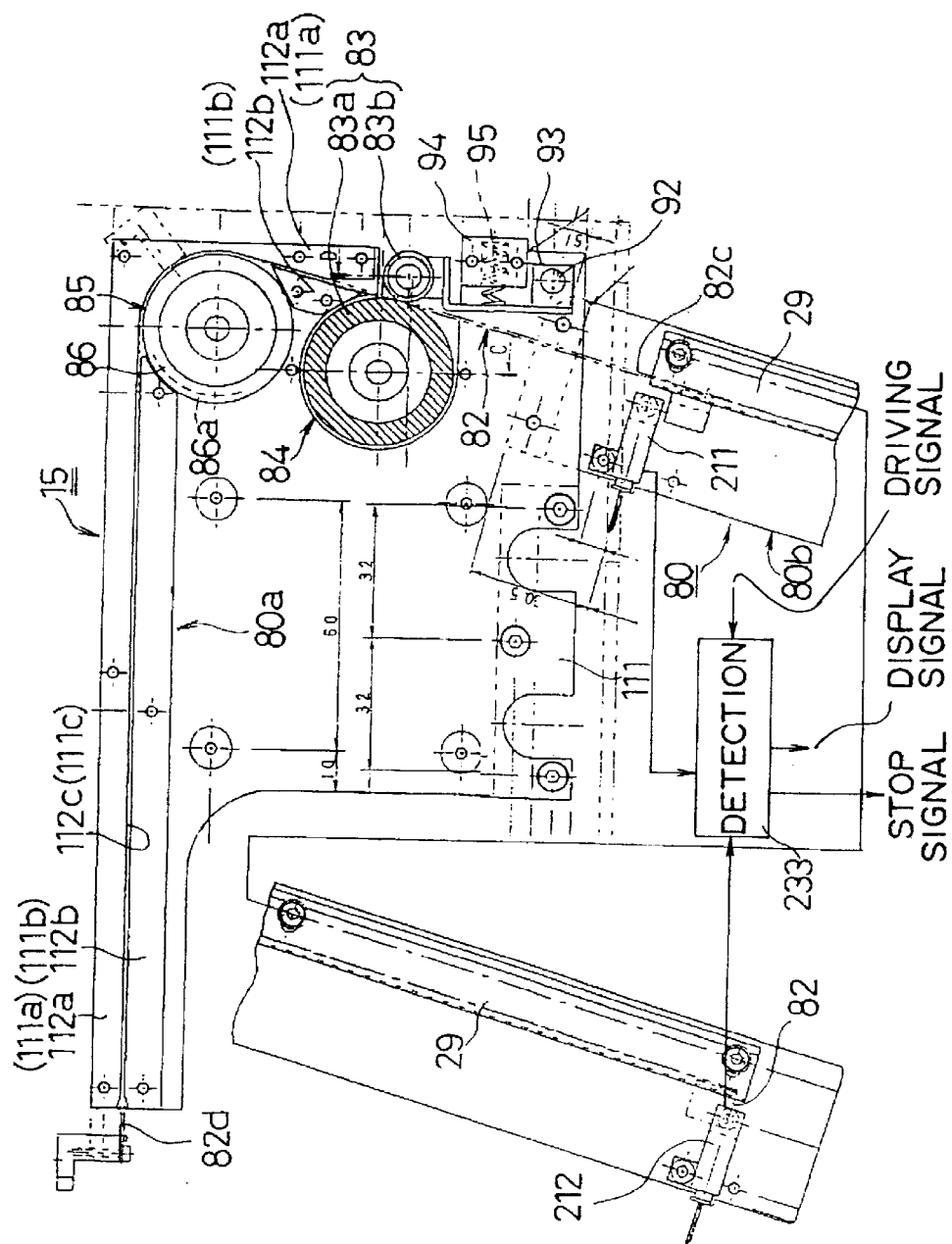
FIG. 22 is a sectional view of a puller in accordance with the second embodiment of the invention.
Figure 23:
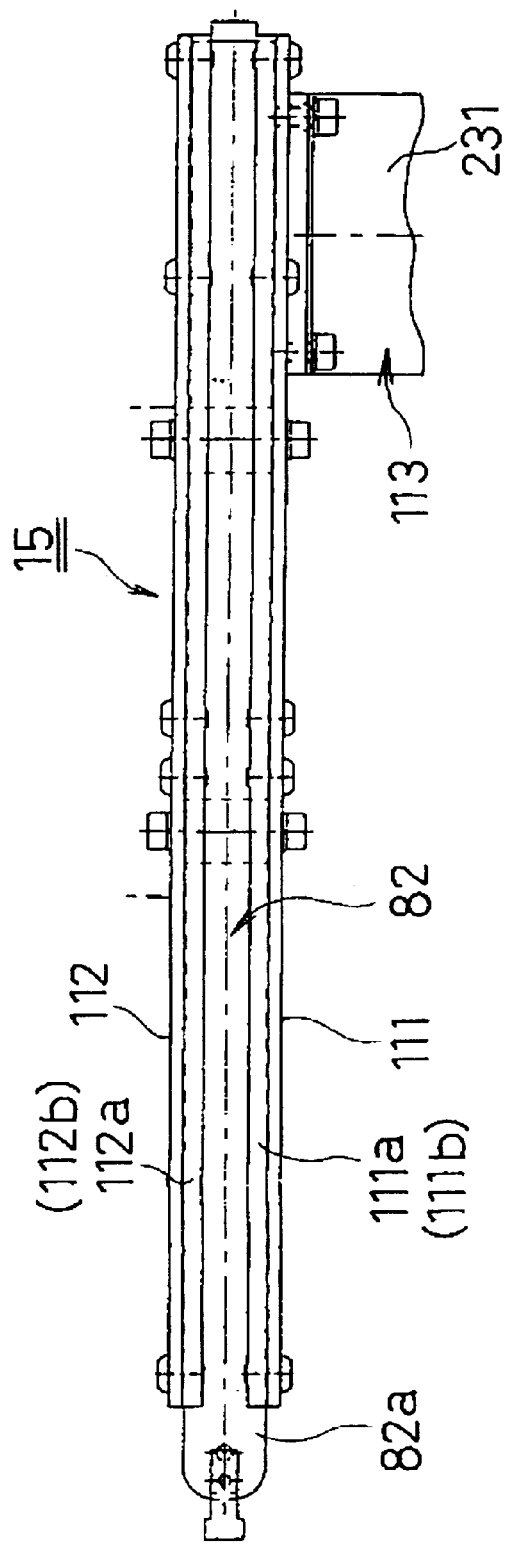
FIG. 23 is a plan view of the puller of FIG. 22.
Figure 24:
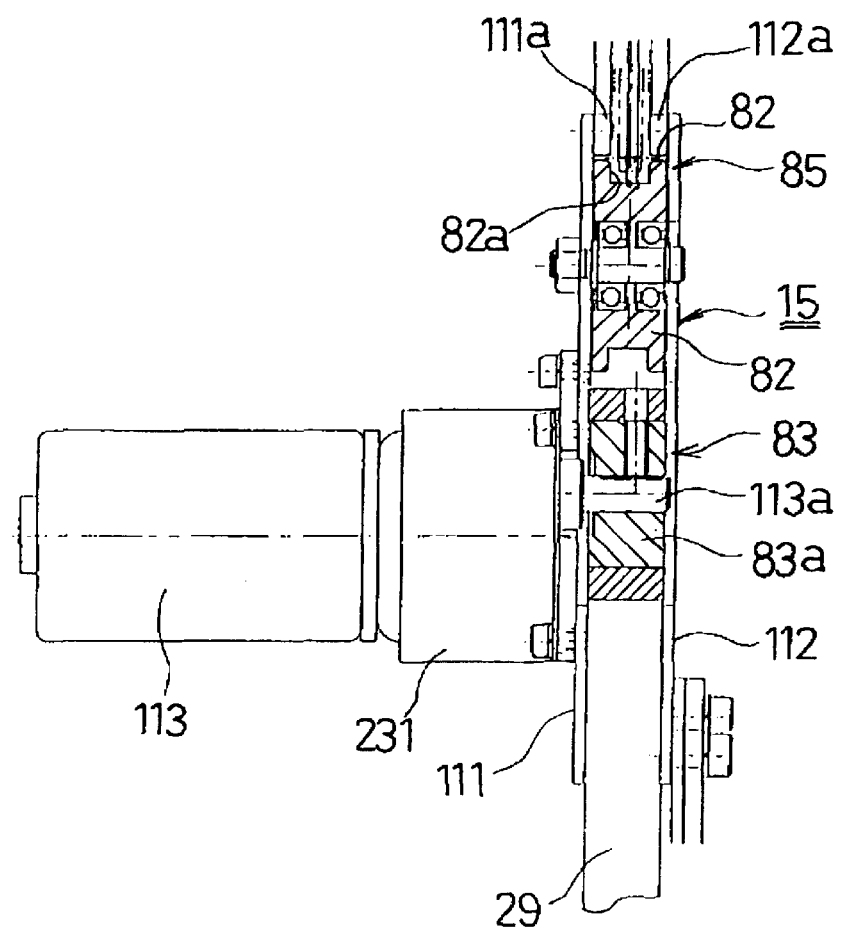
FIG. 24 is a sectional view of a main part of the puller of FIG. 22.

As shown in FIGS. 22 to 24, the puller 15 has some elements in common with that in the first embodiment but has some different elements. Therefore, common members will be designated by the same numerals and duplicate description will be omitted. Hereinbelow, different points will be described.

A pair of driving rollers 83 are provided just behind a guide roller 86 that constitutes a direction changing section 85, and a rectilinear-advancement guide 29 for preventing flexure of a leaf spring 82 in the same manner as the guide 24b on the tail end side in the first embodiment is employed as a guide 80b on a tail end side behind the pair of driving rollers.

One rail member 111a, 112a constituting a guide 80a on a fore end side extends along outside of the guide roller 86 to immediate front of a pressure roller 83b of the pair of driving rollers 83, and the other rail member 111b, 112b is interrupted by the guide roller 86 but extends also between the guide roller 86 and the driving roller 83a. As a result, the leaf spring 82 can be advanced and retracted with satisfactory rectilinearity by means of the rail members 111a and 112a and the rail members 111b and 112b and, at the same time, the leaf spring 82 can be advanced and retracted without play between the guide roller 86 and the rail members 111a and 112a, accordingly, with stable and reliable change of directions of the spring along the guide roller 86 without slip and bulge.

The guide roller 86 is provided with brims so as to configure a groove 86a having the same width as a rail width of the rail members 111a, 112a, 111b, and 112b. With this configuration, the change of the directions can be carried out with constraint only on both edges of the leaf spring 82, and there is an advantage in that damage to the leaf spring 82, particularly, damage to the leaf spring 82 curved with respect to the direction of the width tends to be reduced. Reciprocating positions of the leaf spring 82 are detected by sensors 211 and 212.

The pair of driving rollers 83 are the same as the pair of driving rollers 21 of the pusher 13 in the second embodiment except that a motor shaft 113a is not supported by bearings. In the second embodiment, as described above, the guides 24b and 80b on the tail end side and the pairs of driving rollers 21 and 83 have common configurations, respectively, and the same components may be used for both, so that product cost can be reduced. The driving roller 83a of the pair of driving rollers 83 may be placed in a position of the guide roller 86 in the puller 15 so as to double as the direction changing section 85, and thus the guide roller 86 may be omitted.

The pusher 13 and the puller 15 may be configured and used as substitutes for the pusher 13 and the puller 15 in the loader 5, the unloader 7, the mounting machine 2, and the like of the first embodiment.

Figure 25:
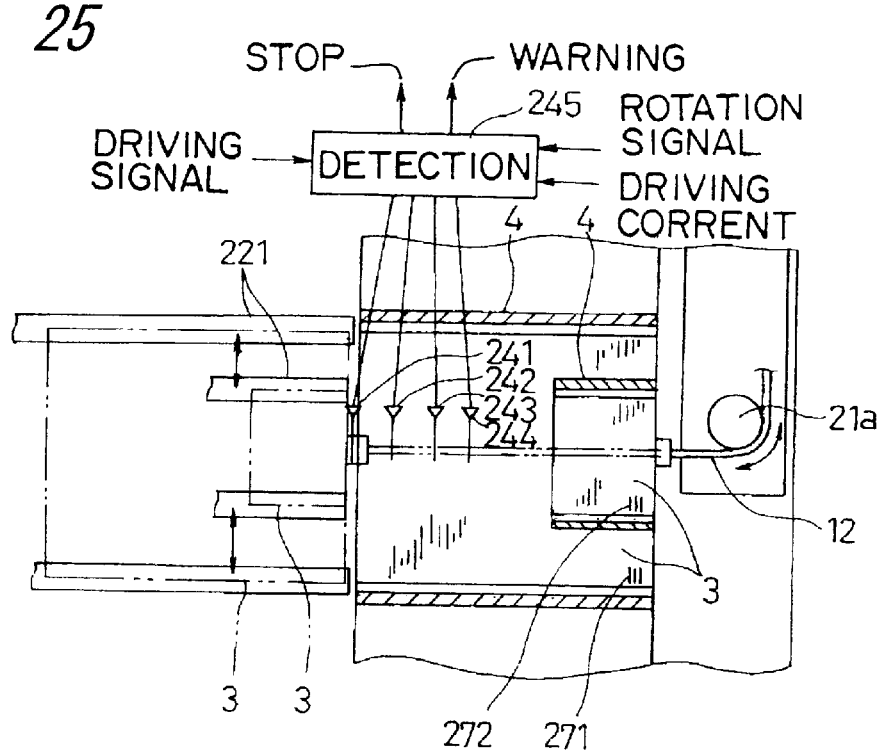
FIG. 25 is a plan view showing a situation in which malfunction of the pusher is detected.
Figure 26:
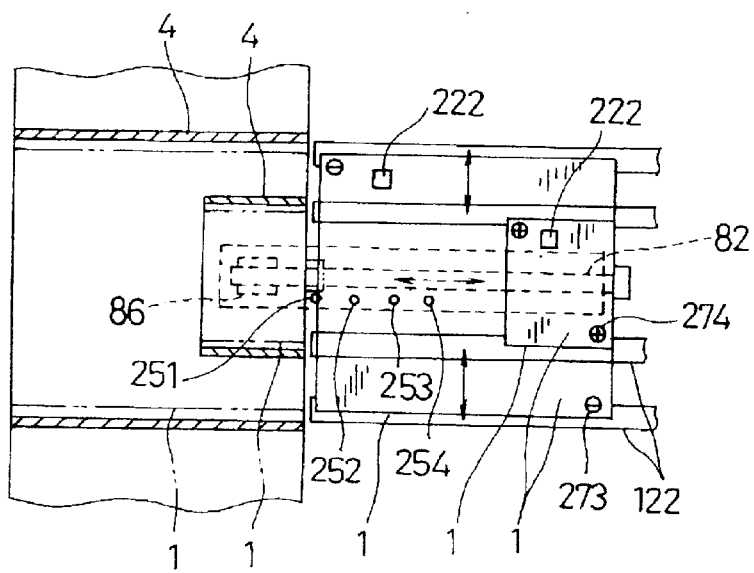
FIG. 26 is a plan view showing a situation in which malfunction of the puller is detected.

When the leaf spring 12 pushes a circuit board 3 from a storage cassette 4 onto conveyor rails 221, as shown in FIG. 25, in the mounting machines 2, the loader 5, the unloader 7, the pusher 13, and the puller 15, a thin circuit board 3 that has, for example, a thickness of 50 μm and that has been bent or is being bent may collide with the conveyor rails 221. When an electronic circuit board 1 mounted with electronic components 222 and residing on the receiving rails 122 is pulled by the leaf spring 82 into a storage cassette 4 as shown in FIG. 26, on the other hand, the electronic circuit board 1 and the electronic components 222 may collide with the storage cassette 4 because of such bend as described above of the electronic circuit board 1.

Such an abnormal collision may damage the leaf spring 12, 82 and may cause breakage and early loss of life of the spring. Fracture of a circuit board 3 or an electronic circuit board 1 bent excessively, and fall from an electronic circuit board 1 of electronic components 222 that have collided make the circuit board 3 or the electronic circuit board 1 a defective product.

On the other hand, the leaf springs 12 and 82 are gradually fatigued and run out of lives thereof while being used repeatedly. Similarly, the motors 48 and 113 have certain life spans. Therefore, malfunction on advancement and retraction of the leaf springs 12 and 82 may occur in course of expiration of the life spans. This malfunction may cause faulty push of a circuit board 3 or faulty pull of an electronic circuit board 1, and vertical movement of cassettes 4 in course of the push of the circuit board 3 or the pull of the electronic circuit board 1 may result in breakage of the circuit board 3 or the electronic circuit board 1 and damage to and failure in a cassette 4 and a lifting and lowering mechanism for the cassette.

Figure 27:
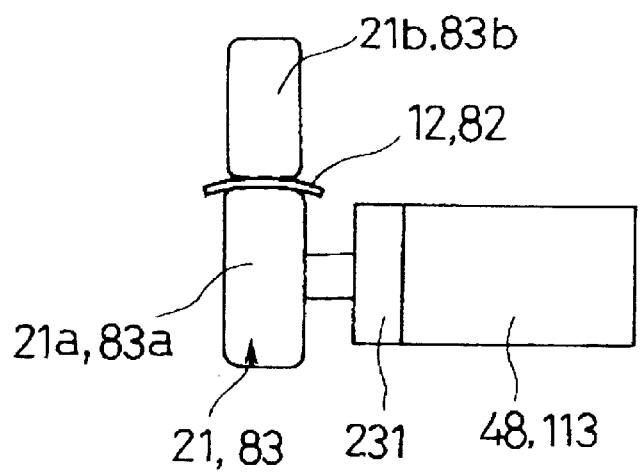
FIG. 27 is a side view showing a motor having a clutch that is a hys torque controller and showing the pair of driving rollers.

In order to cope with such abnormal collision, as shown in FIGS. 19, 24, and 27, the second embodiment is provided with clutches 231 that function as hys torque controllers on the motors 48 and 113. When an external force with a magnitude not smaller than a specified value is exerted on the leaf spring 12, 82, the clutch 231 slips and cuts off a transmission of a driving force of the motor 48, 113 to the leaf spring 12, 82. As a result, fracture and breakage of the leaf spring 12, 82, the circuit board 3, and the electronic circuit board 1, and damage to the same are avoided.

When the clutch 231 slips, the leaf spring 12, 82 is neither advanced nor retracted though the motor 48, 113 is driven continuously, and there occurs a situation where either of the sensors 54 and 55 continues to detect the leaf spring 12 or both the sensors lastingly fail to detect the leaf spring 12 or a situation where either of the sensors 211 and 212 continues to detect the leaf spring 82 or both the sensors lastingly fail to detect the leaf spring 82. Presence or absence of such conditions is judged by an abnormal collision detecting section 232, 233 shown in FIG. 19, 22 for detection of abnormal collision. If abnormal collision is detected, a corresponding motor 48, 113 is stopped. At the same time, an operator is informed of occurrence of the abnormality and a type of the abnormality by a message displayed on the monitor 334 shown in FIG. 1, illumination of the warning light 335, and the like.

Alternatively, the abnormal collision detecting section 232, 233 may detect abnormal collision by monitoring increase in driving current for the motor 48, 113 at an overload not smaller than a given magnitude such that the clutch 231 would slip, and the motor 48, 113 may be stopped by motion control after the detection of abnormal collision by such a method. In this case, such safety means as the clutch 231 is not particularly required, with use of a motor with brake that can be stopped immediately.

Figure 28:
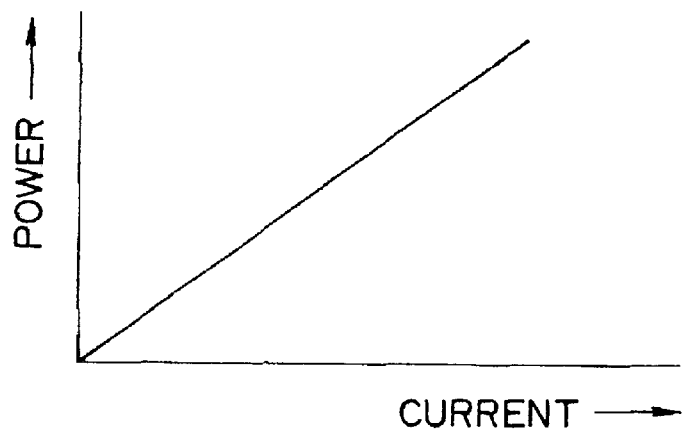
FIG. 28 is a graph showing a relation between forces of a motor and currents.
Figure 29:
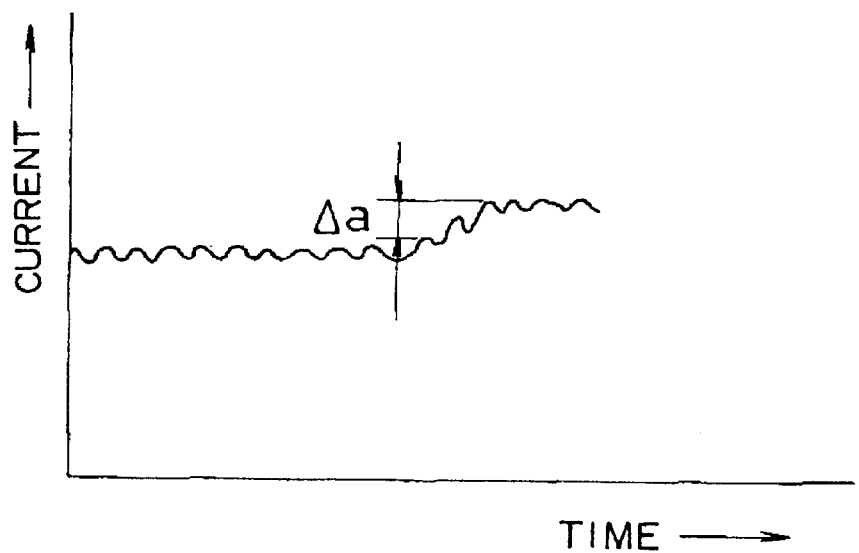
FIG. 29 is a graph showing change in current under normal condition and overload condition.

Though such detection of abnormal collision by driving current for the motor makes use of a relation between driving currents and output values of the motor that is shown in FIG. 28, actual driving currents for the motor pulsate. Therefore, abnormal collision may be detected with a current increase not smaller than a specified value Δa relative to a peak value under normal circumstances as shown in FIG. 29. On condition that equipment that is provided at present is used, abnormality with load increases on the order of 200 g or larger can be detected.

If movement or arrival at a specified position of the leaf spring 12, 82 is not detected by the sensors 54, 55, 211, 212 over a certain period of time or longer despite absence of an increase in the driving current corresponding to an overload on the motor 48, 113 being driven, it is proved that malfunction is not caused by abnormal collision but is caused by droop or bend in middle of the leaf spring 12, 82 with breakage, fatigue or the like, slip in driving, expiration of a life span of the motor 48, 113, or the like.

Alternatively, with comparison of a quantity of travel in advancement and retraction of the leaf spring 12, 82 with a reference quantity of travel that is a quantity of travel in a normal condition, a condition in which the reference quantity of travel is not attained may be judged as abnormality.

If rotation of the motor 48, 113 is not detected by the encoder and the like despite presence of driving signal, abnormality of the motor 48, 113 is proved.

If there is a difference in comparison of quantities of travel, travel speeds, transit time or the like of a plurality of positions (two or more) on the leaf spring 12, 82 and there is no abnormal collision, occurrence of breakage, slack, bend or the like in a section for the comparison in the leaf spring 12, 82 is detected. In this case, a difference in the quantities of travel or the like indicating an increase in a length of the section for the comparison suggests breakage in the leaf spring 12, 82. On the other hand, a difference in the quantities of travel or the like indicating a decrease in the length of the section for the comparison suggests slack, bend or the like in the section for the comparison of the leaf spring 12, 82.

A difference between a quantity of travel in advancement and a quantity of travel in retraction of the leaf spring 12, 82 may be judged as some malfunction.

With the detection as described above, moreover, approach to an abnormal condition with deterioration, decline in function or the like of the leaf spring 12, 82, the motor 48, 113 or the like can be monitored and occurrence of abnormality can be predicted. Therefore, an operator may be notified of such approach, and stop of operation and warning may be executed in a final stage.

FIG. 25 shows an example provided with an abnormality detecting section 245 that detects travel positions of the fore end of the leaf spring 12 by photo sensors 241 to 244 of reflection type or transmission type, obtains information on advanced and retracted positions of the fore end portion of the leaf spring 12, travel speed, transit time in advancement thereof, and the like, and detects malfunction including abnormal collision with driving signal, driving current, rotation signal of the motor 48, and the like. Such position detecting sensors for the leaf spring 12 may be provided also in the tail end portion correspondingly, and a larger number of types of abnormality can be identified as described above by comparison between detection results in the fore end portion and the tail end portion.

In FIG. 26, proximity sensors 251 to 254 for the leaf spring 82 are provided in place of the photo sensors 241 to 244 in FIG. 25 so as to be capable of detecting malfunction similarly. A number of the photo sensors 241 to 244 or the proximity sensors 251 to 254 may be chosen arbitrarily according to required conditions for detection, and any types of sensors may be used as long as the sensors are capable of detecting positions of the leaf spring 12 or the like.

Figure 30:
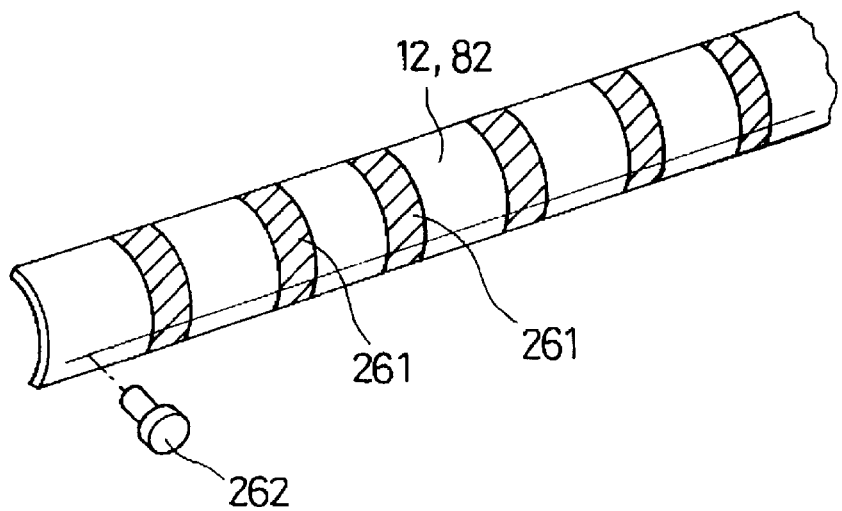
FIG. 30 is a perspective view of a leaf spring, showing an example of a situation in which abnormality is detected.
Figure 31:
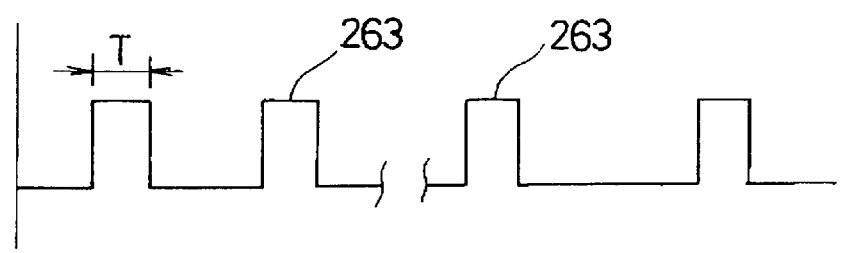
FIG. 31 is a graph showing an example of pulse signals that are obtained from detection in FIG. 30.
Figure 32A:
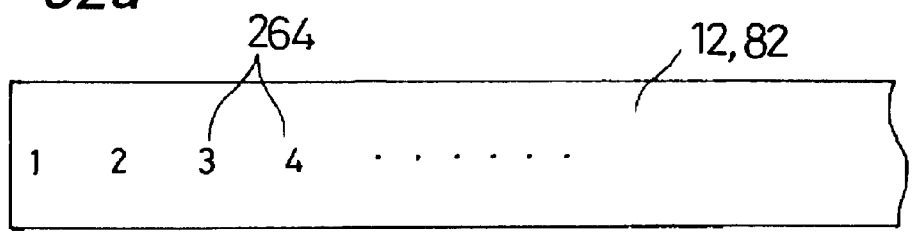
FIGS. 32a to 32d are diagrams showing examples of marks that are provided on the leaf spring for detection of abnormality and that have position signals.
Figure 32B:
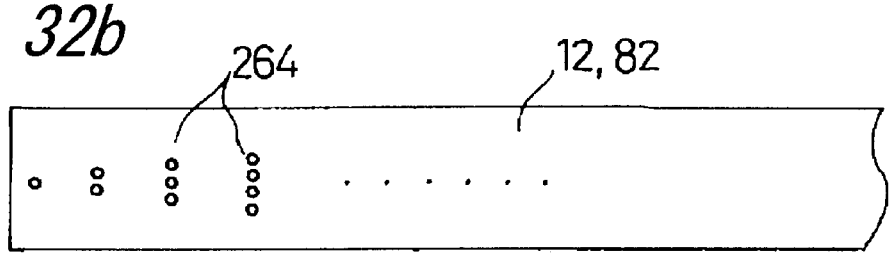
Figure 32C:
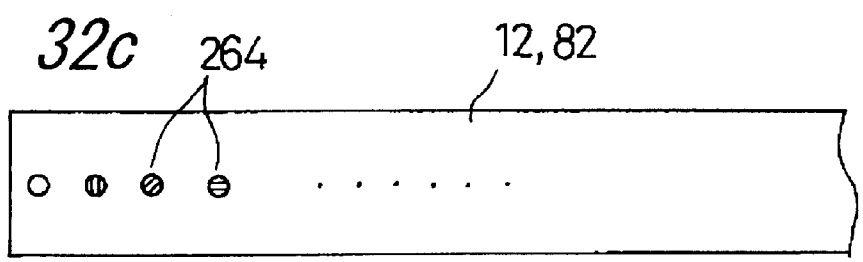
Figure 32D:
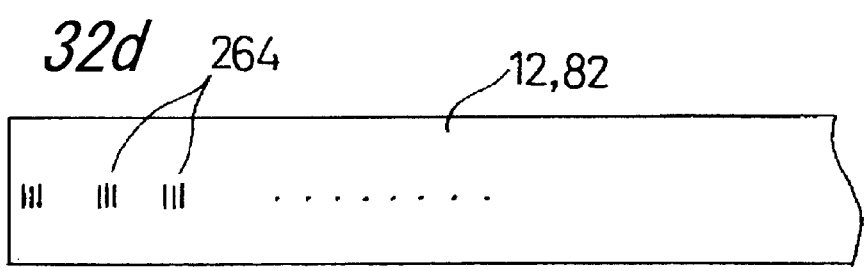
Figure 33:
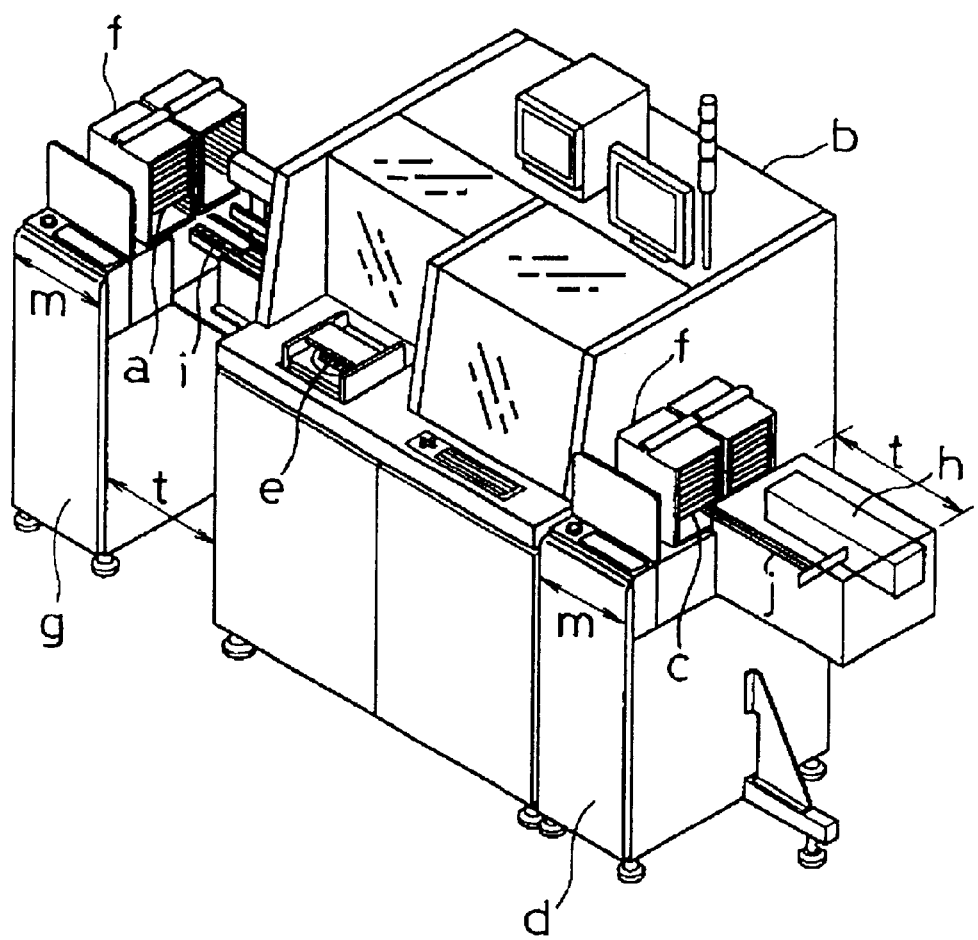
FIG. 33 is a perspective view showing a conventional working apparatus.
Figure 34:
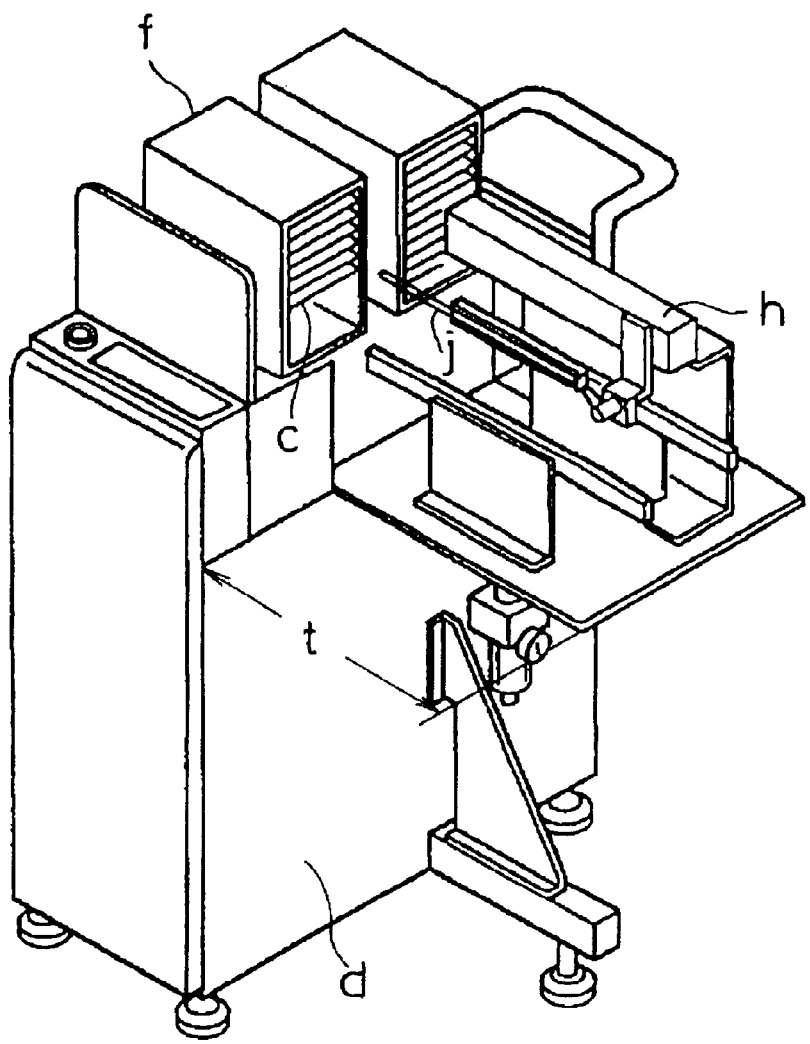
FIG. 34 is a perspective view showing a loader of the apparatus of FIG. 33.
Figure 35:
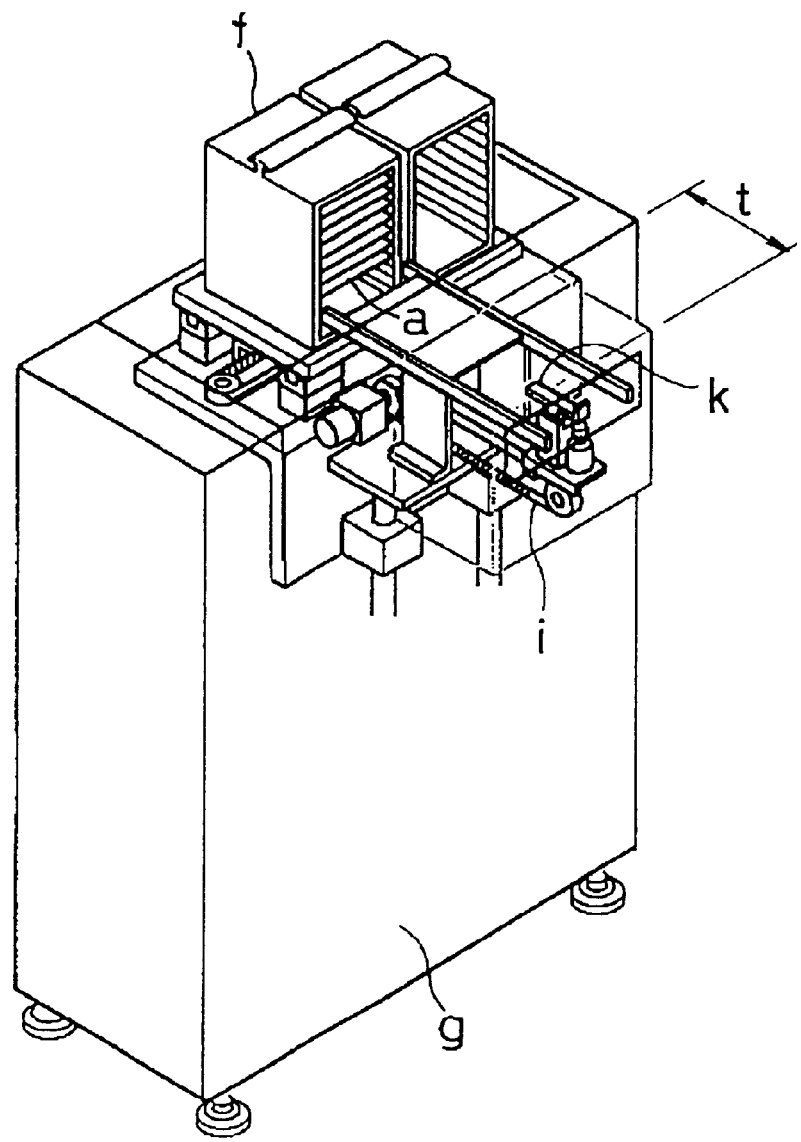
FIG. 35 is a perspective view showing an unloader of the apparatus of FIG. 33.
Figure 36:
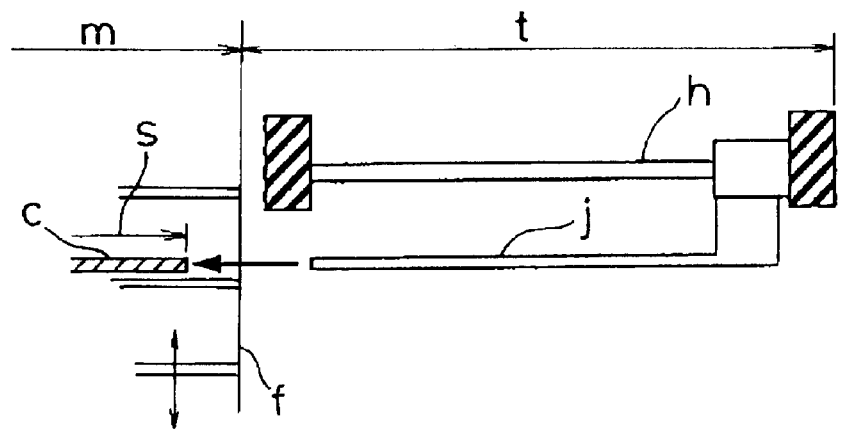
FIG. 36 is a schematic representation showing an operating condition of a conventional pusher.
Figure 37:
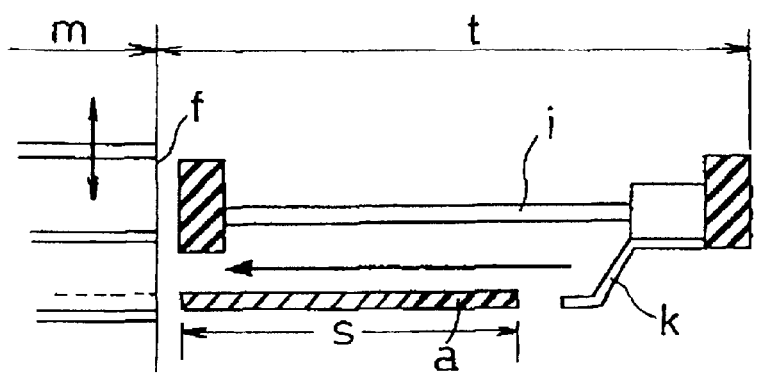
FIG. 37 is a schematic representation showing an operating condition of a conventional puller.

For detection of advanced and retracted positions, quantities of travel, or transit time of middle portions of the leaf spring 12, 82, marks 261 may be provided on the leaf spring 12, 82 so as to be arranged thereon at uniform intervals in a longitudinal direction as shown in FIG. 30, and such travel status may be detected by a reflection type photo sensor 262, converted into such electric signal as shown in FIG. 31, and monitored. Widths and intervals of pulses 263 shown in FIG. 31 and corresponding to the marks 261 the photo sensor 262 detects vary depending on travel speeds of the leaf spring 12, 82, and a count number of the pulses 263 is proportional to quantity of travel of the leaf spring 12, 82. Provided that the count number of the pulses 263 is multiplied by a pitch of arrangement of the marks 261, to what position a point that faced the photo sensor 262 has been advanced or retracted can be detected. Therefore, such a configuration is suitable in the case that comparison of movement of a middle portion of the leaf spring 12, 82 with that of another portion is demanded.

When widths T and intervals of the pulses 263 are gradually increasing though the pulses 263 are occurring, it is proved that rotation and torque of drive system, particularly, of the motor 48, 113 are slowing and decreasing. On the other hand, too high speed of the motor 48, 113 may be unsuitable for handling of circuit boards 3 or electronic circuit boards 1. Therefore, the motor 48, 113 may be served as proper one for operation on condition that a detected pulse width T satisfies an inequality $T_a<T<T_b$ wherein $T_a$ is a lower limit width and $T_b$ is an upper limit width, and the motor 48, 113 may be judged to have run out of the life span when $T_a>T$ holds thereafter.

The same holds for count number N of the pulses 263 within a given period of time. The motor 48, 113 may be served as normal one for operation on condition that an inequality $N_a<N<N_b$ holds wherein $N_a$ is a lower limit value and $N_b$ is an upper limit value, and the motor 48, 113 may be judged to have run out of the life span when $N_a>N$ holds thereafter.

In any of the cases, a process in which the motor 48, 113 runs out of the life span can be monitored and a point in time when the life span will expire can be predicted and notified.

A specific pattern of the marks 261 as described above may be chosen appropriately and any techniques including boring, printing, sticker pasting, engraving, and etching may be adopted for providing the marks.

Such marks 264 as shown in FIGS. 32, for example, having respective position signals may be provided along a longitudinal direction on the leaf spring 12, 82 and may be recognized by optical reading means, so that positions, quantities of travel, and travel speeds of corresponding portions of the spring may be detected. FIG. 32(a) shows an example using numerals, FIG. 32(b) shows an example using numbers of bores or dots, FIG. 32(c) shows an example using colors of dots, and FIG. 32(d) shows an example using bar codes. The marks may be provided over the full length but may preferably be provided in required positions in a required range so as not to be wasted.

In the pusher 13 shown in FIG. 25 and the puller 15 shown in FIG. 26, a stroke by which a circuit board 3 or an electronic circuit board 1 with a large size is pushed out or pulled in and a stroke for a circuit board 3 or an electronic circuit board 1 with a small size, i.e., reference quantities of travel are the same. That is, in the pusher 13, the push-out stroke is set at a quantity corresponding to a largest circuit board (c), and front edges of cassettes 4 are set so as to coincide with the initial push position for circuit boards 3 regardless of sizes of the cassettes. In the puller 15, the pull-in stroke is set at a quantity corresponding to a largest electronic circuit board 3, and front edges of cassettes 4 are set so as to coincide with the terminal pull position for electronic circuit boards 1 regardless of sizes of the cassettes.

Such arrangement, however, causes center positions for installation of the cassettes 4 having different sizes to be out of alignment, and therefore references for handling circuit boards 3 or electronic circuit boards 1 are changed, so that adjustment in the handling is required. Besides, a problem arises in that a wasteful stroke is uselessly large for pushing or pulling a small circuit board 1 or a small electronic circuit board 1.

Such a problem as described above can be resolved as follows. Circuit boards 3 and electronic circuit boards 1 are provided with marks 271 to 274 exemplified in FIGS. 25 and 26 and indicating types of the boards, the marks 271 to 274 are read optically, positions of starting points are determined from reference quantities of travel that match sizes corresponding to the read marks 271 to 274, and the boards are pushed or pulled from the positions of starting points by the reference quantities of travel.

What is claimed is:

1. A pusher for pushing an object from a first position to a second position, the pusher comprising:

a leaf spring, a driving section for nipping the leaf spring to advance and retract it in a longitudinal direction so that advancement of a fore end portion of the leaf spring in a pushing direction causes the object facing the fore end portion of the leaf spring to be pushed from the first position to the second position, a direction changing section for bending a side of a tail end portion of the leaf spring being advanced and retracted relative to a side of the fore end portion extending in the pushing direction so as to change directions of advancement and retraction of the leaf spring at the direction changing section, a position detecting section for detecting a position of the leaf spring, and an abnormality detecting section for detecting an abnormal action of the leaf spring on the basis of a position detection signal from the position detecting section.

2. A pusher according to claim 1, wherein the abnormality detecting section is capable of detecting an abnormal collision of the leaf spring.

3. A pusher according to claim 2, further comprising a clutch capable of transmitting a driving force from the driving section to the leaf spring when a load to the leaf spring is smaller than a predetermined value, and cutting off the transmission of the driving force from the driving section to the leaf spring when the load to the leaf spring is larger than another predetermined value, and wherein the abnormality detecting section is capable of detecting the abnormal collision when the position detecting section fails to detect the advancing and retracting of the leaf spring because the clutch is cutting off the transmission of the driving force from the driving section to the leaf spring.

4. A pusher according to claim 3, wherein the abnormality detecting section is capable of detecting the abnormal action other than the abnormal collision when the position detecting section fails to detect the advancing and retracting of the leaf spring even though the clutch transmits the driving force from the driving section to the leaf spring.

5. A pusher according to claim 1, wherein the abnormal detecting section is capable of detecting the abnormal action of the leaf spring on the basis of a comparison of quantities of travel detected by the position detecting section and reference quantities of travel corresponding to quantities of travel when the leaf spring normally acts.

6. A pusher according to claim 1, wherein the abnormal detecting section is capable of detecting the abnormal action of the leaf spring on the basis of a comparison of quantities of travel of not less than two positions of the leaf spring detected by the position detecting section.

7. A pusher according to claim 1, wherein the driving section is capable of advancing and retracting the leaf spring by a pair of driving rollers which nips the leaf spring.

8. A pusher according to claim 7, wherein the pair of driving rollers includes a driving roller and a pressure roller,
wherein both of the driving roller and the pressure roller have cylindrical shape,
wherein the driving roller also performs as the direction changing section, and
wherein the pressure roller is on a bisector passing through a center of the driving roller between the side of the fore end portion and the side of the tail end portion of the leaf spring.

9. A pusher according to claim 1, wherein the leaf spring is curved with respect to a direction of a width thereof, and
wherein a radius of curvature of the leaf spring with respect to the direction of the width is between 30 to 50 mm.

10. A puller for pulling an object from a first position to a second position, the puller comprising:
a leaf spring with a hook section on a fore end portion thereof,
a driving section for nipping the leaf spring to advance and retract it in a longitudinal direction so that retraction of a fore end portion of the leaf spring in a pulling direction causes the object to be hooked by the hook section and pulled from the first position to the second position,
at least one direction changing section for bending a side of a tail end portion of the leaf spring being advanced and retracted relative to a side of the fore end portion extending in the pulling direction so as to change direction of advancement and retraction of the leaf spring at the direction changing section,
a position detecting section for detecting a position of the leaf spring, and
an abnormality detecting section for detecting an abnormal action of the leaf spring on the basis of a position detection signal from the position detecting section.

11. A puller according to claim 10, wherein the abnormality detecting section is capable of detecting an abnormal collision of the leaf spring.

12. A puller according to claim 11, wherein further comprising a clutch capable of transmitting a driving force from the driving section to the leaf spring when a load to the leaf spring is smaller than a predetermined value, and cutting off the transmission of the driving force from the driving section to the leaf spring when the load to the leaf spring is larger than another predetermined value, and wherein the abnormality detecting section is capable of detecting the abnormal collision when the position detecting section fails to detect the advancing and retracting of the leaf spring because the clutch is cutting off the transmission of the driving force from the driving section to the leaf spring.

13. A puller according to claim 10, wherein the abnormality detecting section is capable of detecting the abnormal action other than the abnormal collision when the position detecting section fails to detect the advancing and retracting of the leaf spring even though the clutch transmits the driving force from the driving section to the leaf spring.

14. A puller according to claim 10, wherein the abnormal detecting section is capable of detecting the abnormal action of the leaf spring on the basis of a comparison of quantities of travel detected by the position detecting section and reference quantities of travel corresponding to quantities of travel when the leaf spring normally acts.

15. A puller according to claim 10, wherein the abnormal detecting section is capable of detecting the abnormal action of the leaf spring on the basis of a comparison of quantities of travel of not less than two positions of the leaf spring detected by the position detecting section.

16. A puller according to claim 10, wherein the driving section is capable of advancing and retracting the leaf spring by a pair of driving rollers which nips the leaf spring.

17. A puller according to claim 10, wherein the side of the fore end portion of the leaf spring is curved in a predetermined range with respect to a direction of a width thereof, and
wherein a radius of the curvature of the fore end portion with respect to the direction of the width is between 20 to 50 mm.

18. A loader for feeding a handling section with board-like members stored in a plurality of steps of a storage cassette, the loader comprising:
a lifting and lowering section for lifting and lowering the storage cassette, and
a pushing section for pushing the board-like member from the step of the storage cassette to the handling section,
wherein the pushing section comprises:
a leaf spring,
a driving section for nipping the leaf spring to advance and retract it in a longitudinal direction so that advancement of a fore end portion of the leaf spring into the storage cassette in a pushing direction causes the board-like member facing the fore end portion of the leaf spring to be pushed from the storage cassette to the handling section,
a direction changing section for bending a side of a tail end portion of the leaf spring being advanced and retracted relative to a side of the fore end portion extending in the pushing direction so as to change directions of advancement and retraction of the leaf spring at the direction changing section, a position detecting section for detecting a position of the leaf spring, and an abnormality detecting section for detecting an abnormal action of the leaf spring on the basis of a position detection signal from the position detecting section.

19. An unloader for taking board-like members out of a handling section into a plurality of steps of a storage cassette, the unloader comprising:

a lifting and lowering section for lifting and lowering the storage cassette, and a pulling section for pulling the board-like member from the handling section into the step in the storage cassettes, wherein the pulling section comprising:
a leaf spring with a hook section on a fore end portion thereof,
a driving section for nipping the leaf spring to advance and retract it in a longitudinal direction so that retraction of the fore end portion of the leaf spring in a pulling direction causes the board-like member to be hooked by the hook section and pulled from the handling portion to the step of the storage cassette,
at least one direction changing section for bending a side of a tail end portion of the leaf spring being advanced and retracted relative to a side of the fore end portion extending in the pulling direction so as to change directions of advancement and retraction of the leaf spring at the direction changing section,
a position detecting section for detecting a position of the leaf spring, and
an abnormality detecting section for detecting an abnormal action of the leaf spring on the basis of a position detection signal from the position detecting section.

20. A working apparatus for performing repetitive operations on a plurality of board-like members, the working apparatus comprising:

a working machine for repeating taking in of the board-like member from a take-in section, operations on the delivered board-like member, and taking out of the finished board-like member to a take-out section, a loader for feeding the take-in section with the board-like members stored on a plurality of steps in a first storage cassette, and an unloader for taking the board-like members out of the take-out section into a plurality of steps in a second storage cassette, wherein the loader comprises:
a first lifting and lowering section for lifting and lowering the first storage cassette, and
a pushing section for pushing the board-like members from the steps in the first storage cassette to the take-in section of the working machine,
the pushing section comprising:
a first leaf spring,
a first driving section for nipping the first leaf spring to advance and retract it in a longitudinal direction so that advancement of a fore end portion of the first leaf spring into the second storage cassette in a pushing direction causes the board-like member facing the fore end portion of the first leaf spring to be pushed from the first storage cassette to the take-in section of the working machine,
a first direction changing section for bending a side of a tail end portion of the first leaf spring being advanced and retracted relative to a side of the fore end portion extending in the pushing direction so as to change directions of advancement and retraction of the first leaf spring at the first direction changing section, and
a first guide for guiding the side of the fore end portion and the side of the tail end portion of the first leaf spring with respect to the direction changing section in the directions of advancement and retraction,
a first position detecting section for detecting a position of the first leaf spring, and
a first abnormality detecting section for detecting an abnormal action of the first leaf spring on the basis of a position detecting signal from the first position detecting section, and wherein the unloader comprises:
a second lifting and lowering section for lifting and lowering the second storage cassette, and
a pulling section for pulling the board-like members from the take-out section of the working machine into the steps in the second storage cassette,
the pulling section comprising:
a second leaf spring with a hook section on a fore end portion thereof,
a second driving section for nipping the second leaf spring to advance and retract it in a longitudinal direction so that retraction of the fore end portion of the second leaf spring in a pulling direction causes the platelike member to be hooked by the hook section and pulled from take-out section of the working machine to the steps in the second storage cassette,
at least one second direction changing section for bending a side of a tail end portion of the second leaf spring being advanced and retracted relative to a side of the fore end portion extending in the pulling direction so as to change directions of advancement and retraction of the second leaf spring at the second direction changing section,
second guide for guiding the side of the fore end portion and the side of the tail end portion of the second leaf spring with respect to the second direction changing section in the direction of advancement and retraction,
a second position detecting section for detecting a position of the second leaf spring, and
a second abnormality detecting section for detecting an abnormal action of the second leaf spring on the basis of a position detection signal from the second position detecting section.

* * * * *